(12) United States Patent
Chuang et al.

(10) Patent No.: US 12,133,470 B2
(45) Date of Patent: Oct. 29, 2024

(54) SEMICONDUCTOR STRUCTURE AND METHOD OF FORMING THE SAME

(71) Applicant: Taiwan Semiconductor Manufacturing Company Ltd., Hsinchu (TW)

(72) Inventors: Harry-Hak-Lay Chuang, Zhubei (SG); Kuei-Hung Shen, Hsinchu (TW); Chern-Yow Hsu, Hsin-Chu County (TW); Shih-Chang Liu, Kaohsiung County (TW)

(73) Assignee: TAIWAN SEMICONDUCTOR MANUFACTURING CPMPANY, LTD., Hsinchu (TW)

( * ) Notice: Subject to any disclaimer, the term of this patent is extended or adjusted under 35 U.S.C. 154(b) by 108 days.

(21) Appl. No.: 18/059,073

(22) Filed: Nov. 28, 2022

(65) Prior Publication Data
US 2023/0088093 A1    Mar. 23, 2023

Related U.S. Application Data

(60) Division of application No. 16/931,632, filed on Jul. 17, 2020, now Pat. No. 11,515,473, which is a continuation of application No. 16/048,247, filed on Jul. 28, 2018, now Pat. No. 10,720,571, which is a division of application No. 15/159,669, filed on May 19, 2016, now Pat. No. 10,270,025.
(Continued)

(51) Int. Cl.
*H10N 50/10*    (2023.01)
*H10B 61/00*    (2023.01)
*H10N 50/01*    (2023.01)
*H10N 50/80*    (2023.01)

(52) U.S. Cl.
CPC ............. *H10N 50/10* (2023.02); *H10B 61/22* (2023.02); *H10N 50/01* (2023.02); *H10N 50/80* (2023.02)

(58) Field of Classification Search
CPC ..... H01L 27/222; H01L 27/228; H01L 43/02; H01L 43/08; H01L 43/12; H10N 50/01; H10N 50/10; H10N 50/80; H10B 61/22
See application file for complete search history.

(56) References Cited

U.S. PATENT DOCUMENTS 8,866,242 B2    10/2014  Li
9,105,572 B2    8/2015   Kanaya
(Continued)

*Primary Examiner* — Matthew E Warren
(74) *Attorney, Agent, or Firm* — Haynes and Boone, LLP

(57) ABSTRACT

The present disclosure provides a semiconductor structure, including an $N^{th}$ metal layer over a transistor region, where N is a natural number, and a bottom electrode over the $N^{th}$ metal layer. The bottom electrode comprises a bottom portion having a first width, disposed in a bottom electrode via (BEVA), the first width being measured at a top surface of the BEVA, and an upper portion having a second width, disposed over the bottom portion. The semiconductor structure also includes a magnetic tunneling junction (MTJ) layer having a third width, disposed over the upper portion, a top electrode over the MTJ layer and an $(N+1)^{th}$ metal layer over the top electrode. The first width is greater than the third width.

20 Claims, 24 Drawing Sheets

Related U.S. Application Data

(60) Provisional application No. 62/273,469, filed on Dec. 31, 2015.

(56) References Cited

U.S. PATENT DOCUMENTS

| | | | |
|---|---|---|---|
| 9,564,577 B1 | 2/2017 | Hsu | |
| 9,842,986 B2 * | 12/2017 | Chuang | H10N 50/80 |
| 9,985,075 B2 | 5/2018 | Chuang | |
| 2012/0043630 A1 | 2/2012 | Omori | |
| 2013/0119494 A1 | 5/2013 | Li | |
| 2014/0264668 A1 * | 9/2014 | Lee | H10N 50/01 |
| | | | 257/421 |
| 2015/0069480 A1 * | 3/2015 | Kanaya | H10B 61/22 |
| | | | 257/295 |
| 2016/0093668 A1 | 3/2016 | Lu | |
| 2016/0268336 A1 * | 9/2016 | Shum | H10N 50/01 |
| 2016/0365505 A1 | 12/2016 | Lu | |
| 2017/0018704 A1 | 1/2017 | Chuang | |
| 2017/0047374 A1 | 2/2017 | Lu | |
| 2017/0069684 A1 | 3/2017 | Suh | |
| 2017/0084820 A1 * | 3/2017 | Tan | H10N 50/01 |

* cited by examiner

SEMICONDUCTOR STRUCTURE AND METHOD OF FORMING THE SAME

PRIORITY CLAIM AND CROSS-REFERENCE

This application is a divisional of U.S. patent application Ser. No. 16/931,632 filed Jul. 17, 2020, which is a continuation application of U.S. patent application Ser. No. 16/048,247, filed Jul. 28, 2018 issued as U.S. Pat. No. 10,720,571, which is a divisional application of U.S. patent application Ser. No. 15/159,669, filed May 19, 2016, issued as U.S. Pat. No. 10,270,025, which claims priority to U.S. provisional patent application Ser. No. 62/273,469 filed Dec. 31, 2015, the disclosures of each are hereby incorporated by reference in their entirety.

BACKGROUND

Semiconductors are used in integrated circuits for electronic applications, including radios, televisions, cell phones, and personal computing devices. One type of well-known semiconductor device is the semiconductor storage device, such as dynamic random access memories (DRAMs), or flash memories, both of which use charges to store information.

A more recent development in semiconductor memory devices involves spin electronics, which combines semiconductor technology and magnetic materials and devices. The spin polarization of electrons, rather than the charge of the electrons, is used to indicate the state of "1" or "0." One such spin electronic device is a spin torque transfer (STT) magnetic tunneling junction (MTJ) device MTJ device includes free layer, tunnel layer, and pinned layer. The magnetization direction of free layer can be reversed by applying a current through tunnel layer, which causes the injected polarized electrons within free layer to exert so-called spin torques on the magnetization of free layer. Pinned layer has a fixed magnetization direction. When current flows in the direction from free layer to pinned layer, electrons flow in a reverse direction, that is, from pinned layer to free layer. The electrons are polarized to the same magnetization direction of pinned layer after passing pinned layer; flowing through tunnel layer; and then into and accumulating in free layer. Eventually, the magnetization of free layer is parallel to that of pinned layer, and MTJ device will be at a low resistance state. The electron injection caused by current is referred to as a major injection.

When current flowing from pinned layer to free layer is applied, electrons flow in the direction from free layer to pinned layer. The electrons having the same polarization as the magnetization direction of pinned layer are able to flow through tunnel layer and into pinned layer. Conversely, electrons with polarization differing from the magnetization of pinned layer will be reflected (blocked) by pinned layer and will accumulate in free layer. Eventually, magnetization of free layer becomes anti-parallel to that of pinned layer, and MTJ device will be at a high resistance state. The respective electron injection caused by current is referred to as a minor injection.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
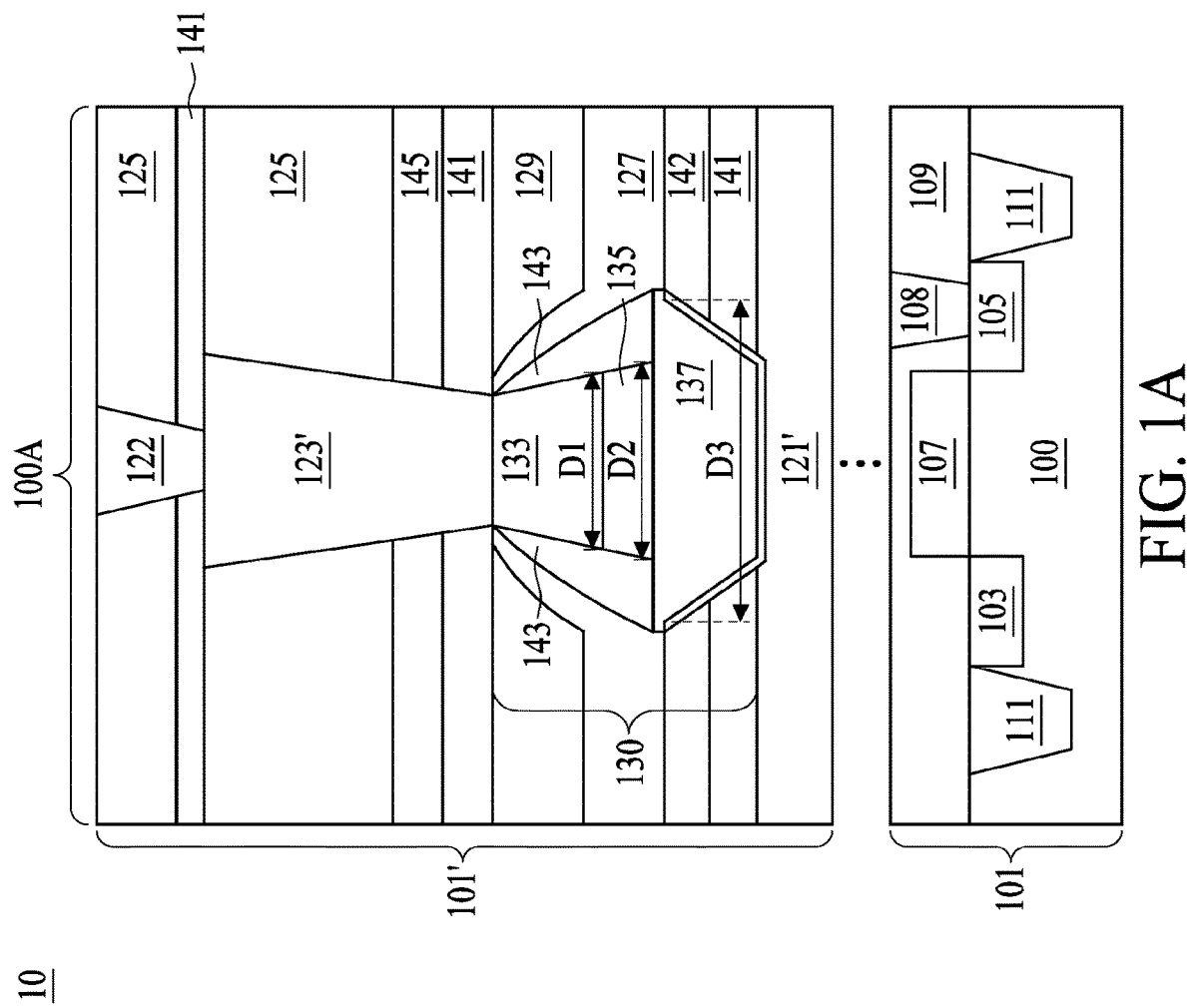
FIG. 1A is a cross section of a semiconductor structure, in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Notwithstanding that the numerical ranges and parameters setting forth the broad scope of the disclosure are approximations, the numerical values set forth in the specific examples are reported as precisely as possible. Any numerical value, however, inherently contains certain errors necessarily resulting from the standard deviation found in the respective testing measurements. Also, as used herein, the term "about" generally means within 10%, 5%, 1%, or 0.5% of a given value or range. Alternatively, the term "about" means within an acceptable standard error of the mean when considered by one of ordinary skill in the art. Other than in the operating/working examples, or unless otherwise expressly specified, all of the numerical ranges, amounts, values and percentages such as those for quantities of materials, durations of times, temperatures, operating conditions, ratios of amounts, and the likes thereof disclosed herein should be understood as modified in all instances by the term "about." Accordingly, unless indicated to the contrary, the numerical parameters set forth in the present disclosure and attached claims are approximations that can vary as desired. At the very least, each numerical parameter should at least be construed in light of the number of reported significant digits and by applying ordinary rounding techniques. Ranges can be expressed herein as from one endpoint to another endpoint or between two endpoints. All ranges disclosed herein are inclusive of the endpoints, unless specified otherwise.

Embedded MRAM cell in a CMOS structure has been continuously developed. A semiconductor circuit with embedded MRAM cell includes an MRAM cell region and a logic region separated from the MRAM cell region. For example, the MRAM cell region may locate at the center of the aforesaid semiconductor circuit while the logic region may locate at a periphery of the semiconductor circuit. Note the previous statement is not intended to be limiting. Other arrangement regarding the MRAM cell region and the logic region are enclosed in the contemplated scope of the present disclosure.

In the MRAM cell region, a transistor structure can be disposed under the MRAM structure. In some embodiments, the MRAM cell is embedded in the metallization layer prepared in a back-end-of-line (BEOL) operation. For example, the transistor structures in the MRAM cell region and in the logic region are disposed in a common semiconductor substrate, prepared in a front-end-of-line operation, and are substantially identical in the aforesaid two regions in some embodiments. The MRAM cell can be embedded in any position of the metallization layer, for example, between adjacent metal line layers distributed horizontally parallel to a surface of the semiconductor substrate. For instance, the embedded MRAM can be located between the $4^{th}$ metal line layer and the $5^{th}$ metal line layer in an MRAM cell region. Horizontally shifted to the logic region, the $4^{th}$ metal line layer is connected to the $5^{th}$ metal line layer though a $4^{th}$ metal via. In other words, taking the MRAM cell region and the logic region into consideration, the embedded MRAM occupies a thickness of at least a portion of the $5^{th}$ metal line layer and the $4^{th}$ metal via. The number provided for the metal line layer herein is not limiting. In general, people having ordinary skill in the art can understand that the MRAM is located between an $N^{th}$ metal line layer and an $(N+1)^{th}$ metal line layer, where N is a natural number.

The embedded MRAM includes a magnetic tunneling junction (MTJ) composed of ferromagnetic materials. A bottom electrode and a top electrode are electrically coupled to the MTJ for signal/bias conveyance. Following the example previously provided, the bottom electrode is further connected to the $N^{th}$ metal line layer, whereas the top electrode is further connected to the $(N+1)^{th}$ metal line layer. The remaining spaces are filled with dielectric layers for protection and electrical insulation between $N^{th}$ metal line layer and the $(N+1)^{th}$ metal line layer. In some embodiments, the dielectric layers may include materials different from those in the top electrode, the MTJ, the bottom electrode, and metal in the metal line layer in order to achieve desired feature geometry and insulating performance.

There is, however, excessive loss of the dielectric layers surrounding the bottom electrode and in proximity to the $N^{th}$ metal line. For example, the etchant used for defining the top electrode, the MTJ layer and the bottom electrode is non-selective to any of the aforesaid layers and may over-etch the underlying dielectric layers. Result of no selectivity between the bottom electrode and the underlying dielectric layers may cause the $N^{th}$ metal line below the dielectric layers to be exposed or excessively thinned. This damage applies to both the MRAM cell region and the logic region. Thus, the damage to the dielectric layer leads to the underlying metal, for example, Cu atom, migration and henceforth the occurrence of short circuit in both the MRAM cell region and the logic region.

Furthermore, in the process of forming the MTJ, a suitable removing process, such as dry etching, is adopted subsequent to a deposition process of the MTJ stack such that the MTJ is patterned. During the dry etching process, particles are scattered due to bombarding the bottom electrode material. Those scattered particles may be sputtered back to neighboring features, such as the sidewall of the as-patterned MTJ, and lead to short circuit or current leakage.

The present disclosure provides a semiconductor structure where the bottom electrode has a greater width than that of a bottom of the MTJ or a bottom of the top electrode. In addition, the MRAM may include a spacer disposed on the bottom electrode. Thus, the etching operation of the bottom electrode is separated from the etching operation of the top electrode and the MTJ by a spacer formation operation. The operation introduced in the present disclosure prevents the dielectric layers surrounding the bottom electrode via from being damaged and effectively reduce the chance of migration of underlying metal atoms.

Referring to FIG. 1A, FIG. 1A is a cross section of a semiconductor structure 10, in accordance with some embodiments of the present disclosure. The semiconductor structure 10 can be a semiconductor circuit including a MRAM cell region 100A. In some embodiments, the semiconductor structure 10 may include other regions. The MRAM cell region 100A has a transistor structure 101 in a semiconductor substrate 100. In some embodiments, the semiconductor substrate 100 may be but is not limited to, for example, a silicon substrate. In one embodiment, substrate 100 may include other semiconductor materials, such as silicon germanium, silicon carbide, gallium arsenide, or the like. In the present embodiment, the semiconductor substrate 100 is a p-type semiconductor substrate (P-Substrate) or an n-type semiconductor substrate (N-Substrate) comprising silicon. Alternatively, the substrate 100 includes another elementary semiconductor, such as germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. In yet another alternative, the semiconductor substrate 100 is a semiconductor on insulator (SOI). In other alternatives, semiconductor substrate 100 may include a doped epi layer, a gradient semiconductor layer, and/or a semiconductor layer overlying another semiconductor layer of a different type, such as a silicon layer on a silicon germanium layer. The semiconductor substrate 100 may or may not include doped regions, such as a p-well, an n-well, or combination thereof.

The semiconductor substrate 100 further includes heavily doped regions such as sources 103 and drains 105 at least partially in the semiconductor substrate 100. A gate 107 is positioned over a top surface of the semiconductor substrate 100 and between the source 103 and the drain 107. Contact plugs 108 are formed in inter-layer dielectric (ILD) 109, and may be electrically coupled to the transistor structure 101. In some embodiments, the ILD 109 is formed on the semiconductor substrate 100. The ILD 109 may be formed by a variety of techniques for forming such layers, e.g., chemical vapor deposition (CVD), low-pressure CVD (LPCVD), plasma-enhanced CVD (PECVD), sputtering and physical vapor deposition (PVD), thermal growing, and the like. The ILD 109 above the semiconductor substrate 100 may be formed from a variety of dielectric materials and may, for example, be an oxide (e.g., Ge oxide), an oxynitride (e.g., GaP oxynitride), silicon dioxide ($SiO_2$), a nitrogen-bearing oxide (e.g., nitrogen-bearing $SiO_2$), a nitrogen-doped oxide (e.g., $N_2$-implanted $SiO_2$), silicon oxynitride ($Si_xO_yN_z$), and the like.

FIG. 1A shows a planar transistor having a doped region in the semiconductor substrate 100. However, the present disclosure is not limited thereto. Any non-planar transistor, such as a FinFET structure, can have raised doped regions.

In some embodiments, a shallow trench isolation (STI) 111 is provided to define and electrically isolate adjacent transistors. A number of STI 111 are formed in the semiconductor substrate 100. The STI 111, which may be formed of suitable dielectric materials, may be provided to isolate a transistor electrically from neighboring semiconductor devices such as other transistors. The STI 111 may, for example, include an oxide (e.g., Ge oxide), an oxynitride (e.g., GaP oxynitride), silicon dioxide ($SiO_2$), a nitrogen-bearing oxide (e.g., nitrogen-bearing $SiO_2$), a nitrogen-doped oxide (e.g., $N_2$-implanted $SiO_2$), silicon oxynitride ($Si_xO_yN_z$), and the like. The STI 111 may also be formed of any suitable "high dielectric constant" or "high K" material, where K is greater than or equal to about 8, such as titanium oxide ($Ti_xO_y$, e.g., $TiO_2$), tantalum oxide ($Ta_xO_y$, e.g., $Ta_2O_5$), barium strontium titanate (BST, $BaTiO_3/SrTiO_3$), and the like. Alternatively, the STI 111 may also be formed of any suitable "low dielectric constant" or "low K" dielectric material, where K is less than or equal to about 4.

Referring to FIG. 1A, a metallization structure 101' is disposed above the transistor structure 101. Because the $N^{th}$ metal layer 121' may not be the first metal layer over the transistor structure 101, the omission of a portion of the metallization structure 101' is represented by dots. In the MRAM cell region 100A, an MTJ structure 130 is disposed between an $N^{th}$ metal line 121' of the $N^{th}$ metal layer 121 and an $(N+1)^{th}$ metal line 123' of the $(N+1)^{th}$ metal layer 123. In some embodiments, the metal lines are filled with electrically conductive material, e.g. copper, gold or another suitable metal or alloy, to form a number of conductive vias. Metal lines in different metal layers form an interconnect structure composed of substantially pure copper (for example, with a weight percentage of copper being greater than about 90 percent, or greater than about 95 percent) or copper alloys, and may be formed using the single and/or dual damascene processes. The interconnect structure may further include metal vias 122 connecting metal lines 123' in the metal layers. Metal vias are filled with electrically conductive material similar to metal lines. In addition, metal lines and metal vias may be, or may not be, substantially free from aluminum. Interconnect structure includes a plurality of metal layers, namely $M_1$, $M_2$ . . . $M_N$. Throughout the description, the term "metal layer" refers to the collection of the metal lines in the same layer. Metal layers $M_1$ through $M_N$ are formed in inter-metal dielectrics (IMDs) 125, which may be formed of oxides such as un-doped Silicate Glass (USG), Fluorinated Silicate Glass (FSG), low-k dielectric materials, or the like. The low-k dielectric materials may have k values lower than 3.8, although the dielectric materials of IMDs 125 may also be close to 3.8. In some embodiments, the k values of the low-k dielectric materials are lower than about 3.0, and may be lower than about 2.5. The via 122 may be formed by a variety of techniques, e.g., electroplating, electroless plating, high-density ionized metal plasma (IMP) deposition, high-density inductively coupled plasma (ICP) deposition, sputtering, physical vapor deposition (PVD), chemical vapor deposition (CVD), low-pressure chemical vapor deposition (LPCVD), plasma-enhanced chemical vapor deposition (PECVD), and the like.

Referring to the MRAM cell region 100A of the semiconductor structure 10, the MTJ structure 130 at least includes a bottom electrode 137, a top electrode 133, and an MTJ 135. In some embodiments, the bottom electrode 137 possesses a trapezoidal recess surrounded by a composite dielectric layer including SiC 141 and tetraethyl orthosilicate (TEOS) 142, for example. Alternatively, the TEOS 142 can be replaced or combined with silicon-rich oxides (SRO). In some embodiments, the bottom electrode 137 may include nitrides such as TiN, TaN or Ta. In some embodiments, the bottom electrode 137 is formed of stacked sublayers where each sublayer may have a different width. Details of the stacked sublayers of the bottom electrode 137 are further described in the following paragraphs associated with FIG. 2.

In some embodiments as shown in the MRAM cell region 100A of FIG. 1A, the $(N+1)^{th}$ metal line 123' is surrounded by SiC 141 in addition to the IMDs 125. As shown in FIG. 1A, sidewalls of the top electrode 133 and the MTJ 135 is laterally surrounded by a spacer 143 composed of, for example, nitrides, oxides, or oxynitrides. In some embodiments, a top surface of the bottom electrode 137 is wider than that at a bottom surface of the top electrode 133 and that at a bottom surface of the MTJ 135 such that the spacer 143 is disposed only on a periphery of the bottom electrode 137. In some embodiments, MTJ 135 and the top electrode 133 are designed to have a predetermined pattern (e.g., a circular shape) from a top view perspective, and the spacer 143 laterally surrounds the sidewall of the MTJ 135 and the top electrode 133. In some embodiments, the side of the spacer 143 away from the MTJ 135 is aligned with a boundary of the bottom electrode 137. In some embodiments, the spacer 143 may be formed in a multi-layer structure. For example, a first spacer material is disposed on the MTJ structure 130 and a second spacer material is formed over the first spacer material. The first spacer material may be different from the second spacer material.

In some embodiments, the spacer 143 is laterally surrounded by a protection layer 127 such as a nitride layer. In some embodiments, the protection layer 127 is optional and can include silicon nitrides. In some embodiments, a dielectric layer 129 can be disposed over the protection layer 127. In some embodiments, a TEOS layer 142 can be disposed over the SiC 141, surrounding the $(N+1)^{th}$ metal line 123'.

In some embodiments, the bottom electrode 137 of the MTJ structure 130 is electrically coupled with the doped region. In some embodiments, the doped region is a drain 105 or a source 103. In other embodiments, the bottom electrode 137 of the MTJ structure 130 is electrically coupled with the gate 107. In some embodiments, the gate 107 of the semiconductor structure 10 can be a polysilicon gate or a metal gate.

Figure 1B:
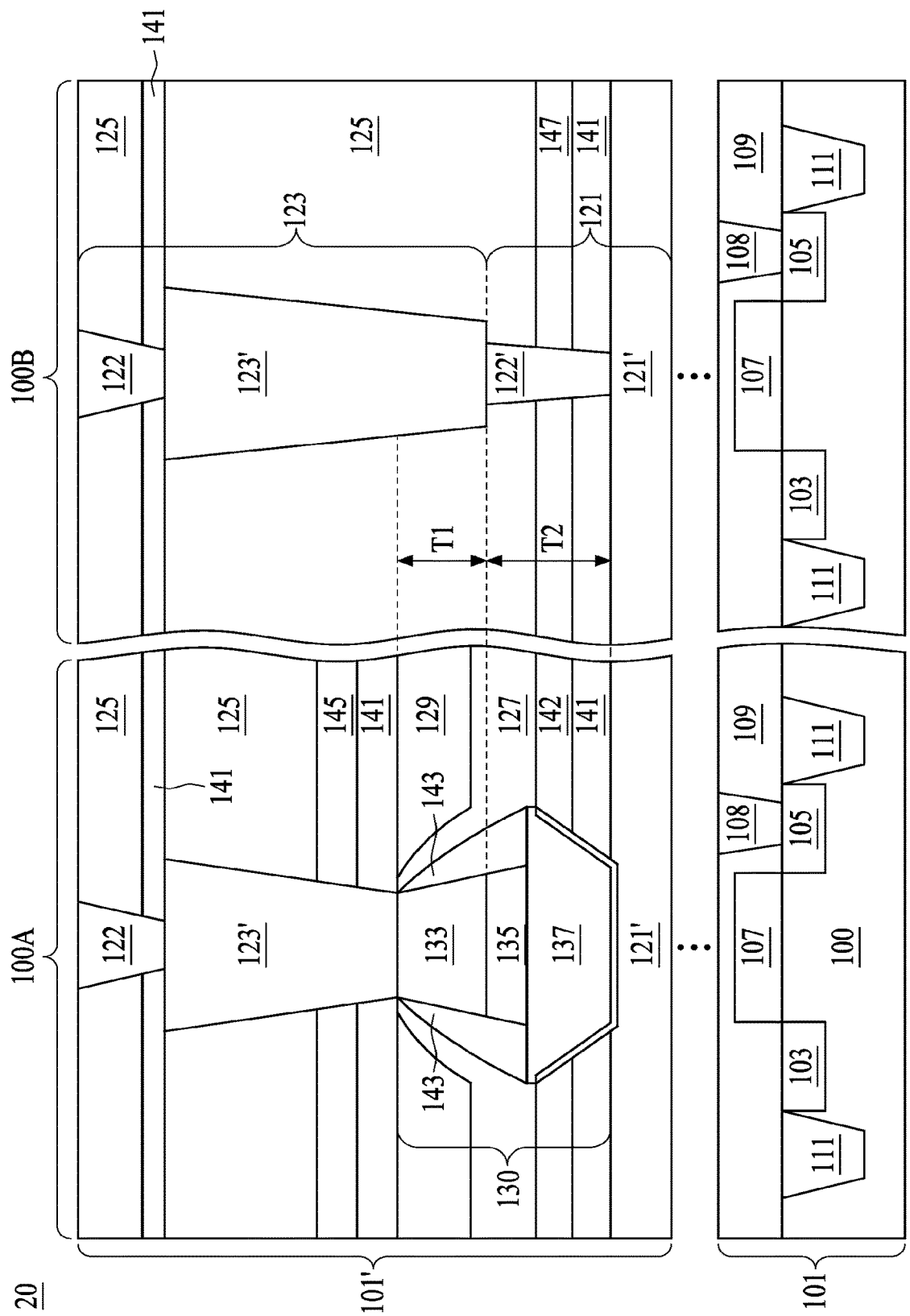
FIG. 1B is a cross section of a semiconductor structure, in accordance with some embodiments of the present disclosure.

FIG. 1B is a cross section of a semiconductor structure 20, in accordance with some embodiments of the present disclosure. Identical numeral labels in FIG. 1B are referred to identical elements or equivalents thereof as shown in FIG. 1A and are not repeated here for simplicity. A difference between the semiconductor structure 20 from the semiconductor structure 10 lies in that, in addition to the MRAM cell region 100A, the semiconductor structure 20 further includes a logic region 100B. Similar to the MRAM region 100A, the logic region 100B has common transistor structure 101 in the semiconductor substrate 100. In the logic region 100B, the $N^{th}$ metal line 121' is connected to the $(N+1)^{th}$ metal line 123' by an $N^{th}$ metal via 122' of the $N^{th}$ metal layer 121. Moreover, comparing the MRAM cell region 100A and the logic region 100B, the $(N+1)^{th}$ metal line 123' and the $N^{th}$ metal via 122' in the logic region 100B is surrounded by the IMDs 125 only. In addition, a thickness of the MTJ structure 130 is substantially equal to or greater than a sum of the thickness T2 of the $N^{th}$ metal via 122' and the thickness T1 of a portion of $(N+1)^{th}$ metal line 123'.

Figure 2:
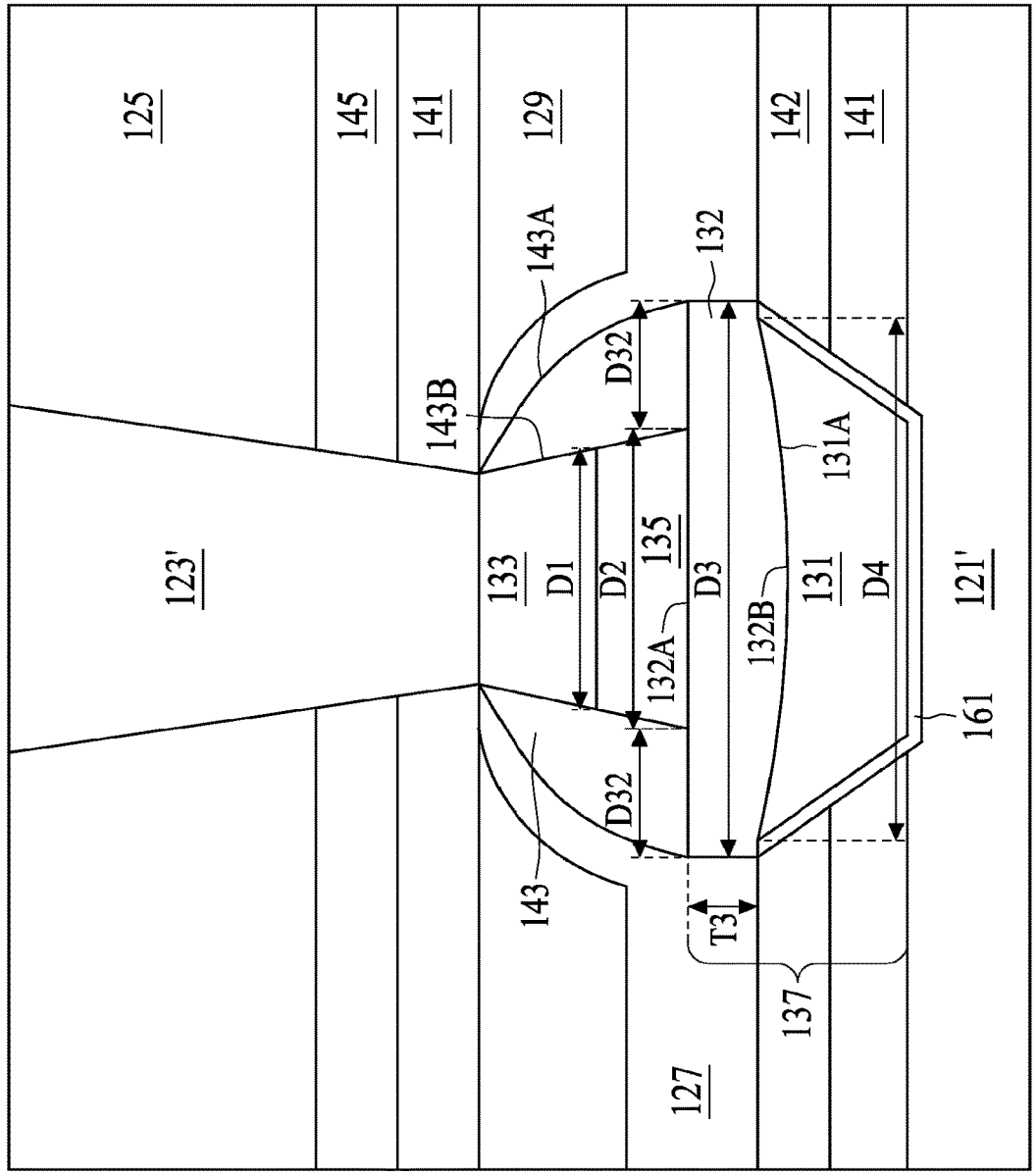
FIG. 2 is a cross section of a semiconductor structure, in accordance with some embodiments of the present disclosure.

FIG. 2 is an enlarged cross section of the semiconductor structure 10 of FIG. 1A, in accordance with some embodiments of the present disclosure. Referring to FIG. 1A and FIG. 2, the bottom electrode 137 includes a stacked structure comprising a bottom portion 131 and an upper portion (top portion) 132. The bottom portion 131 is disposed over and electrically coupled to the $N^{th}$ metal layer, and the upper portion 132 is electrically coupled to the MTJ 135. The bottom portion 131 is disposed in a bottom electrode via (BEVA) surrounded by the composite layer 141/142. In some embodiments, a portion of the BEVA is also surrounded by the $N^{th}$ metal layer 121. In addition, the bottom portion 131 has a top surface 131A substantially coplanar with the upper surface of one of the composite layer 142, for example, a TEOS layer. In some embodiments, the top surface 131A of the bottom portion 131 has a concave shape which can be resulted from the dishing effect in a planarization process, such as a chemical mechanical polishing (CMP) operation, for removing the bottom portion 131 excessively formed over the composite layer 141/142. In some embodiments, the top surface 131A of the bottom portion 131 possesses a width D4. In some embodiments, a barrier layer 161 is optionally formed on sidewalls and the bottom of the BEVA in order to prevent Cu diffusion and provide better adhesion between the bottom electrode 137 and its neighboring layers.

The upper portion 132 of the bottom electrode 137 has a bottom surface 132B contacting the top surface 131A of the bottom portion 131. The upper portion 132 possesses a width D3. In some embodiments, the width D3 is uniform from the center to the edge of the upper portion 132 regardless of measuring from a top surface or a bottom surface of the upper portion 132. The top electrode 133 has a bottom surface having a width D1. The MTJ 135 has a bottom surface having a width D2. Consequently, the width D3 is greater than the width D4. Moreover, the width D3 is greater than the width D1 and the width D2. Referring to FIG. 2, the spacer 143 laterally surrounds the MTJ 135 and the top electrode 133 from sidewalls thereof and forms a hollow cylinder feature viewing from a top view perspective. Therefore, a thickness D32 of the spacer 143 can be measured along the top surface 132A of the upper portion 132. Alternatively stated, the thickness D32 is a thickest portion between one side 143A and the other side 143B of the spacer 143. Thus, the width D3 is substantially equal to summation of the width D2 at the bottom surface of the MTJ 135 and two widths D32 situated at both sides of the MTJ 135 and the top electrode 133. In some embodiments, the thickness D32 is from about 5 nm to about 25 nm. In some embodiments, the width D3 is greater than the width D2 by a range of from 10 nm to 50 nm. In addition, the upper portion 132 has a thickness of T3.

Figure 3:
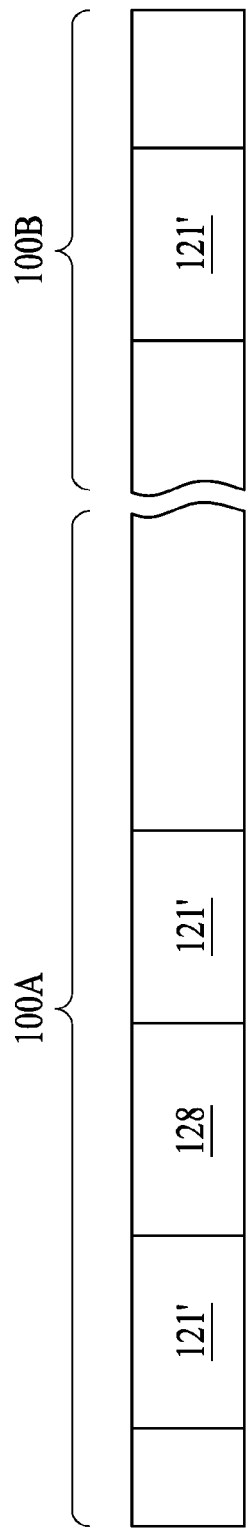
FIGS. 3 to FIG. 23 are cross sections of a CMOS-MEMS structure fabricated at various stages, in accordance with some embodiments of the present disclosure.

FIGS. 3 to FIG. 23 are cross sections of a CMOS-MEMS structure fabricated at various stages, in accordance with some embodiments of the present disclosure. In FIG. 3, a semiconductor structure having a predetermined MRAM cell region 100A and a logic region 100B is provided. In some embodiments, a transistor structure is pre-formed in a semiconductor substrate (not shown in FIG. 3). The integrated circuit device may undergo further CMOS or MOS technology processing to form various features known in the art. For example, one or more contact plugs, such as silicide regions, may also be formed. The contact features may be coupled to the source and drain. The contact features comprise silicide materials, such as nickel silicide (NiSi), nickel-platinum silicide (NiPtSi), nickel-platinum-germanium silicide (NiPtGeSi), nickel-germanium silicide (NiGeSi), ytterbium silicide (YbSi), platinum silicide (PtSi), iridium silicide (IrSi), erbium silicide (ErSi), cobalt silicide (CoSi), other suitable conductive materials, and/or combinations thereof. In an example, the contact features are formed by a salicide (self-aligned silicide) process.

An $N^{th}$ metal line 121' is patterned in a dielectric layer 128 over the transistor structure. In some embodiments, the $N^{th}$ metal line 121' can be formed of an electroplating operation with a Cu seed layer deposited over the patterned dielectric layer 128. In other embodiments, the $N^{th}$ metal line 121' may be formed by a variety of techniques, e.g., electroless plating, high-density ionized metal plasma (IMP) deposition, high-density inductively coupled plasma (ICP) deposition, sputtering, physical vapor deposition (PVD), chemical vapor deposition (CVD), low-pressure chemical vapor deposition (LPCVD), plasma-enhanced chemical vapor deposition (PECVD), and the like. A planarization operation is performed to expose a top surface of the $N^{th}$ metal line 121' and the top surface of the dielectric layer 128.

Figure 4:
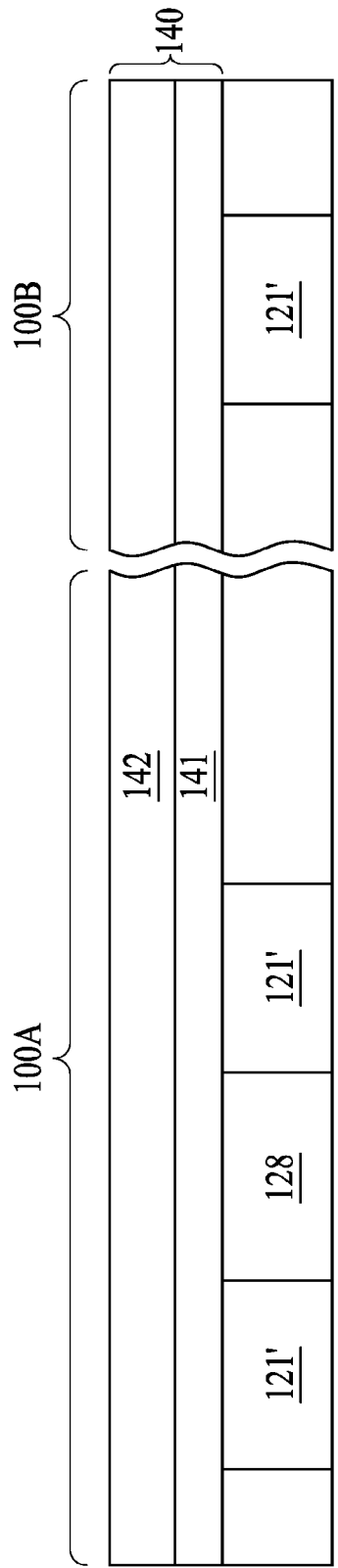
Figure 5:
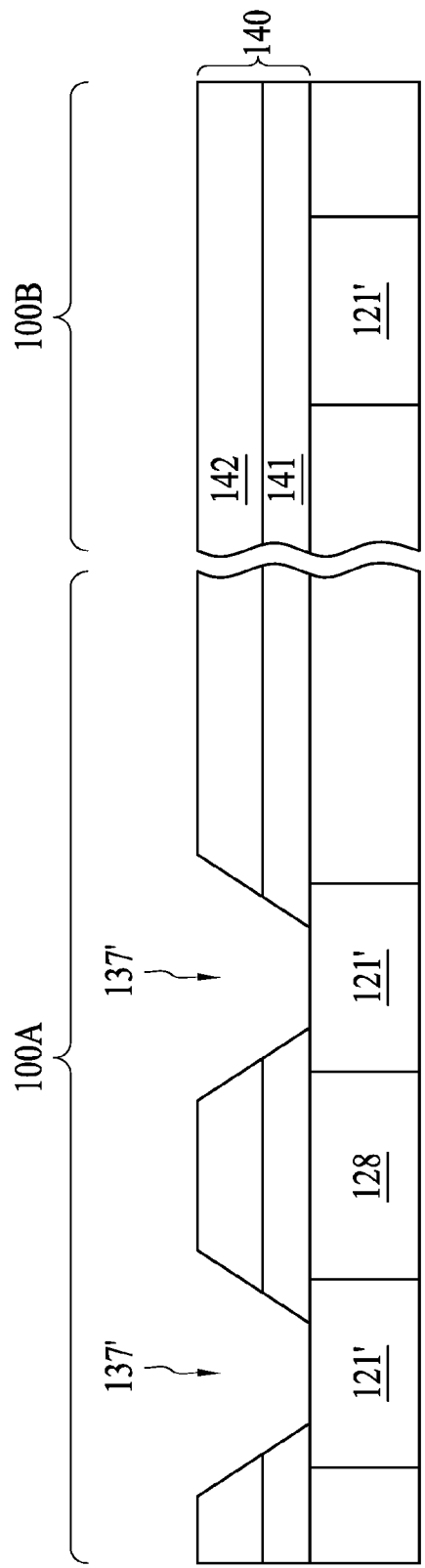

In FIG. 4, a barrier layer 140 in a form of a stacking layer including a SiC layer 141 and a TEOS/SRO layer 142 are blanket deposited over a top surface of the $N^{th}$ metal line 121' and a top surface of the dielectric layer 128, in both the MRAM cell region 100A and the logic region 100B. The barrier layer 140 can be formed by a variety of techniques, e.g., chemical vapor deposition (CVD), low-pressure CVD (LPCVD), plasma-enhanced CVD (PECVD), sputtering and physical vapor deposition (PVD), thermal growing, and the like. In FIG. 5, a photoresist layer (not shown) is patterned over the stacking layer to expose a bottom electrode region of the MTJ structure. As shown in FIG. 5, a bottom electrode via hole 137' is formed in the barrier layer 140 by a suitable dry etch operation. In some embodiments, the dry etch in the present operation includes reactive ion etch (RIE) adopting fluorine-containing gases. In some embodiments, the present dry etch operation can be any suitable dielectric etch to form via trenches in a metallization structure of conventional CMOS technology. Referring to the logic region 100B as shown in FIG. 5, the barrier layer 140 is protected by the photoresist layer (not shown) such that a top surface of the $N^{th}$ metal layer 121' is not exposed as opposed to the counterpart in the MRAM cell region 100A.

Figure 6:
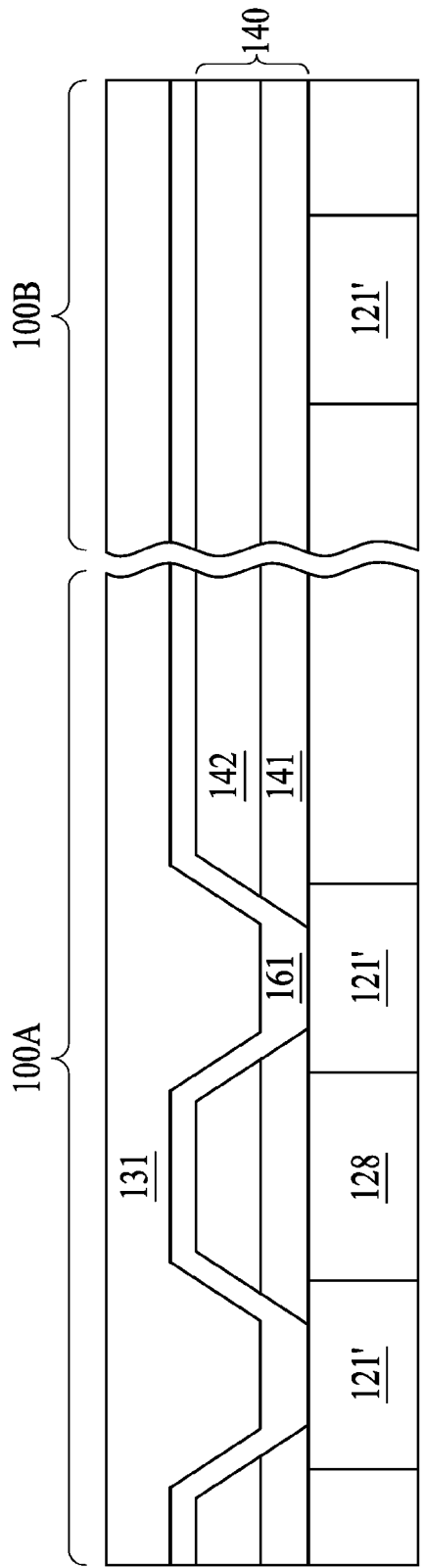
Figure 7:
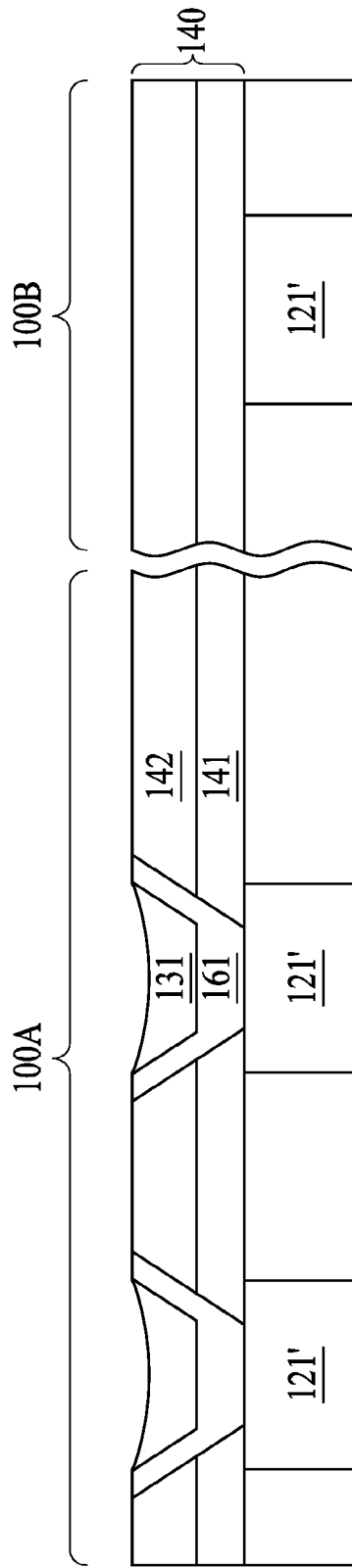
Figure 8:
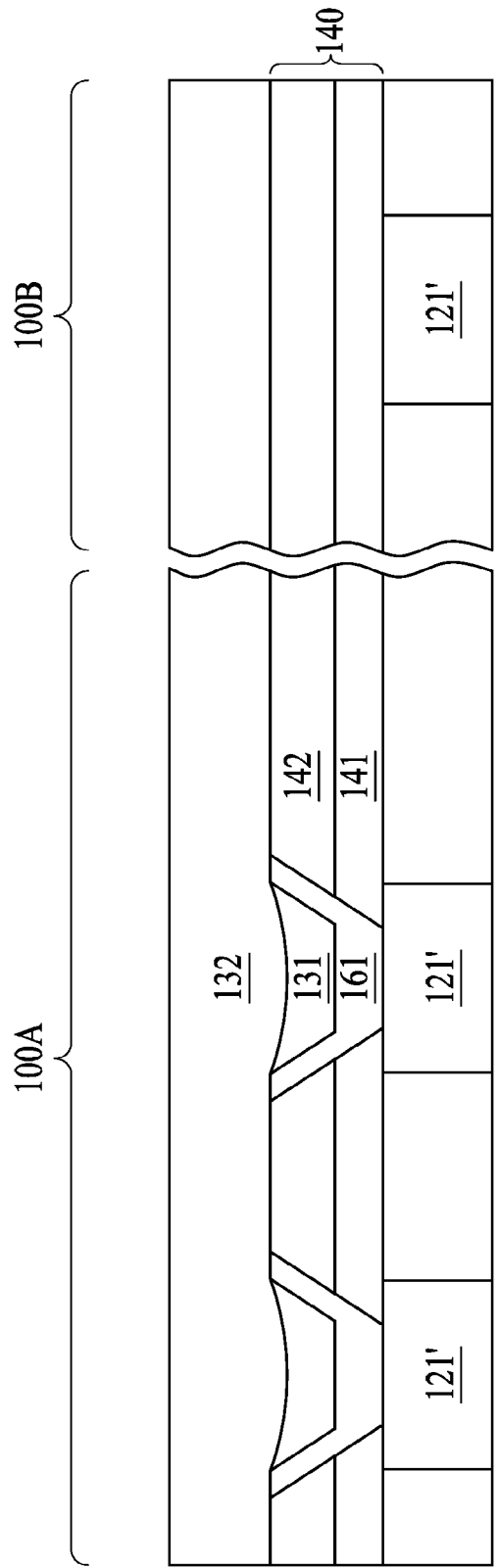
Figure 9:
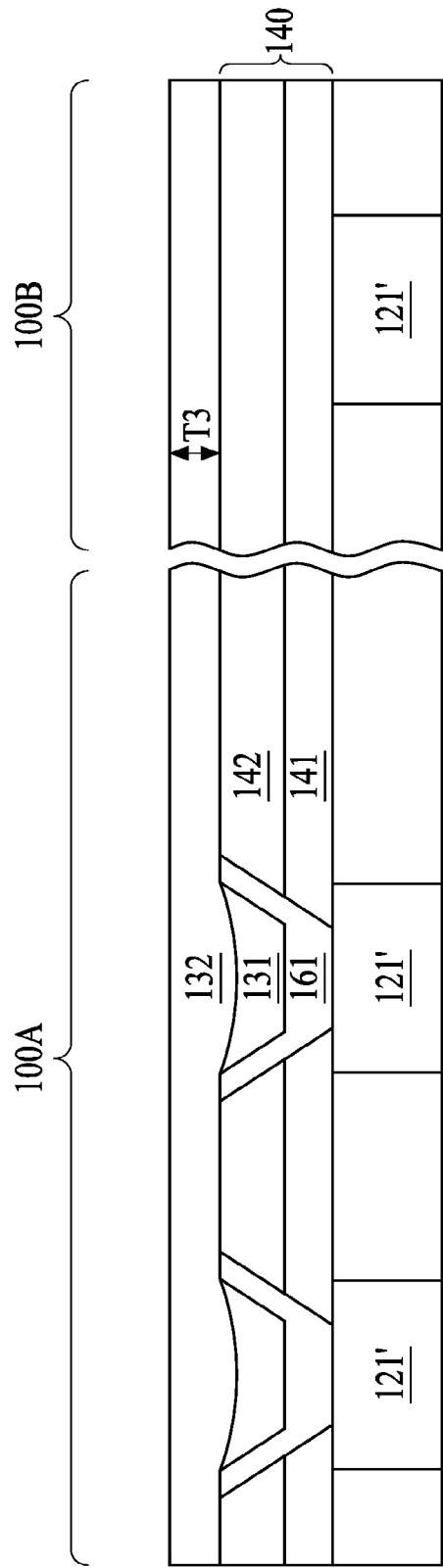

In FIG. 6, a diffusion barrier layer 161 is blanket lined over the bottom electrode via hole 137' in the MRAM cell region 100A and over the barrier layer 140 in the logic region 100B. Subsequently, a bottom portion material 131 is conducted to be disposed over the diffusion barrier layer 161 and the barrier layer 140. The bottom portion material 131 may be formed by a variety of techniques, e.g., high-density ionized metal plasma (IMP) deposition, high-density inductively coupled plasma (ICP) deposition, sputtering, physical vapor deposition (PVD), chemical vapor deposition (CVD), low-pressure chemical vapor deposition (LPCVD), plasma-enhanced chemical vapor deposition (PECVD), and the like. The diffusion barrier layer 161 and the bottom portion material 131 is then etched back to level with a top surface of the barrier layer 140, as illustrated in FIG. 7. In some embodiments, the etch back operation includes a CMP operation. As discussed above, if the opening of the bottom electrode via hole 137' is wider than a predetermined value, a dishing effect occurs in the bottom portion material 131 as a result of CMP operation. In FIG. 8, an upper portion material 132 is blanket formed over the planarized bottom portion material 131 and the barrier layer 140. The deposited upper portion material 132 may be formed by a variety of techniques, e.g., high-density ionized metal plasma (IMP) deposition, high-density inductively coupled plasma (ICP) deposition, sputtering, physical vapor deposition (PVD), chemical vapor deposition (CVD), low-pressure chemical vapor deposition (LPCVD), plasma-enhanced chemical vapor deposition (PECVD), and the like. The upper portion material 132 is then thinned to a predetermined thickness T3, as illustrated in FIG. 9. In some embodiments, the thickness T3 is from about 80 Å to about 300 Å. The bottom portion material 131 and the upper portion material 132 can be composed of metal nitride such as TaN, TiN, Ti/TiN, TaN/TiN, Ta or the combinations thereof. In some embodiments, the upper portion 132 has a material different from a material of the bottom portion 131. The bottom portion material 131 and the upper portion material 132 are collectively referred to as the bottom electrode 137.

Figure 10:
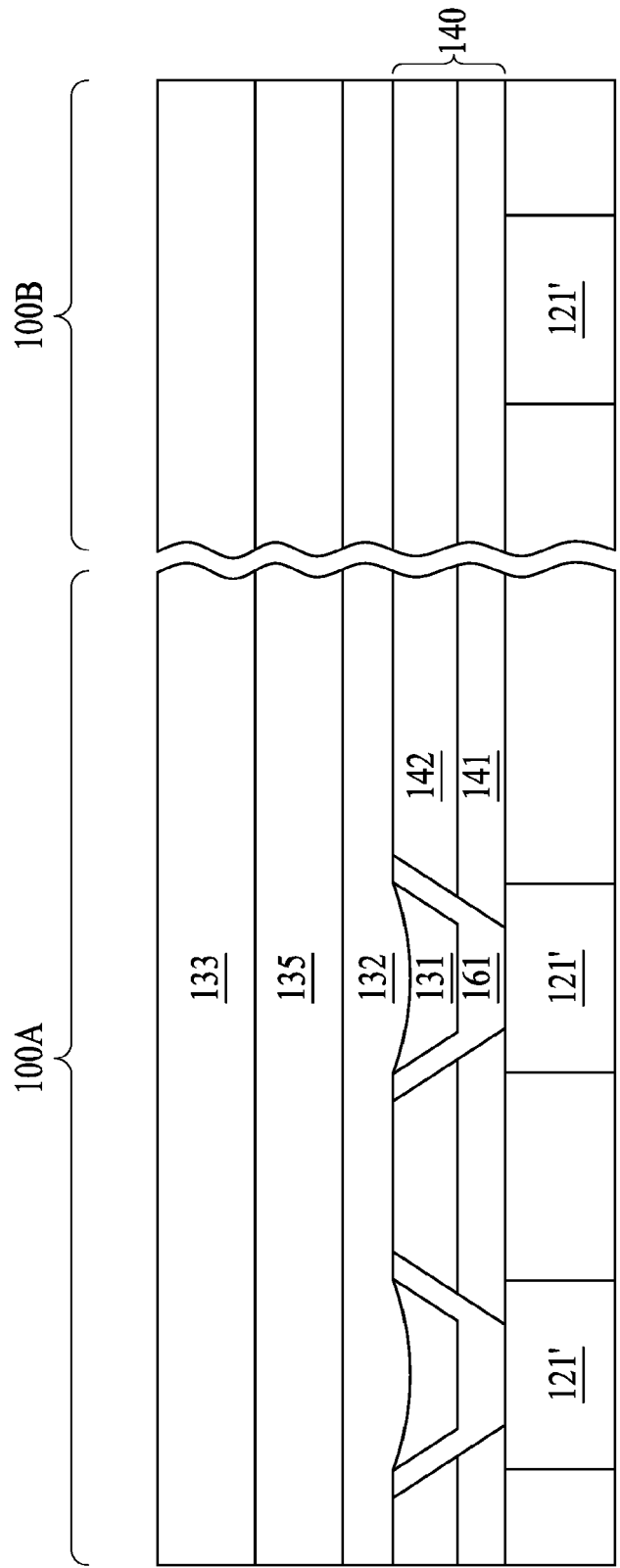

FIG. 10 shows the formation of the MTJ 135 and the top electrode 133 of an MTJ structure 130. In FIG. 10, the MTJ 135 is deposited in a form of multiple material stacks over the bottom electrode 137. In some embodiments, the MTJ 135 is having a thickness of from about 150 Å to about 250 Å. The MTJ 135 may be formed by variety of techniques, e.g., high-density ionized metal plasma (IMP) deposition, high-density inductively coupled plasma (ICP) deposition, sputtering, physical vapor deposition (PVD), chemical vapor deposition (CVD), low-pressure chemical vapor deposition (LPCVD), plasma-enhanced chemical vapor deposition (PECVD), and the like. In some embodiments, the MTJ 135 may include ferromagnetic layers, MTJ spacers, and a capping layer. The capping layer is formed on the ferromagnetic layer. Each of the ferromagnetic layers may include ferromagnetic material, which may be metal or metal alloy, for example, Fe, Co, Ni, CoFeB, FeB, CoFe, FePt, FePd, CoPt, CoPd, CoNi, TbFeCo, CrNi or the like. The MTJ spacer may include non-ferromagnetic metal, for example, Ag, Au, Cu, Ta, W, Mn, Pt, Pd, V, Cr, Nb, Mo, Tc, Ru or the like. Another MTJ spacer may also include insulator, for example, $Al_2O_3$, MgO, TaO, RuO or the like. The capping layer may include non-ferromagnetic material, which may be a metal or an insulator, for example, Ag, Au, Cu, Ta, W, Mn, Pt, Pd, V, Cr, Nb, Mo, Tc, Ru, Ir, Re, Os, $Al_2O_3$, MgO, TaO, RuO or the like. The capping layer may reduce write current of its associated MRAM cell. The ferromagnetic layer may function as a free layer whose magnetic polarity or magnetic orientation can be changed during write operation of its associated MRAM cell. The ferromagnetic layers and the MTJ spacer may function as a fixed or pinned layer whose magnetic orientation may not be changed during operation of its associated MRAM cell. It is contemplated that the MTJ 135 may include an antiferromagnetic layer in accordance with other embodiments. Following the formation of the MTJ 135, a top electrode layer 133 is deposited over the MTJ 135. The top electrode layer 133 may be formed by a variety of techniques, e.g., high-density ionized metal plasma (IMP) deposition, high-density inductively coupled plasma (ICP) deposition, sputtering, physical vapor deposition (PVD), chemical vapor deposition (CVD), low-pressure chemical vapor deposition (LPCVD), plasma-enhanced chemical vapor deposition (PECVD), and the like. In some embodiments, the top electrode layer 133 is composed of TiN.

Figure 11:
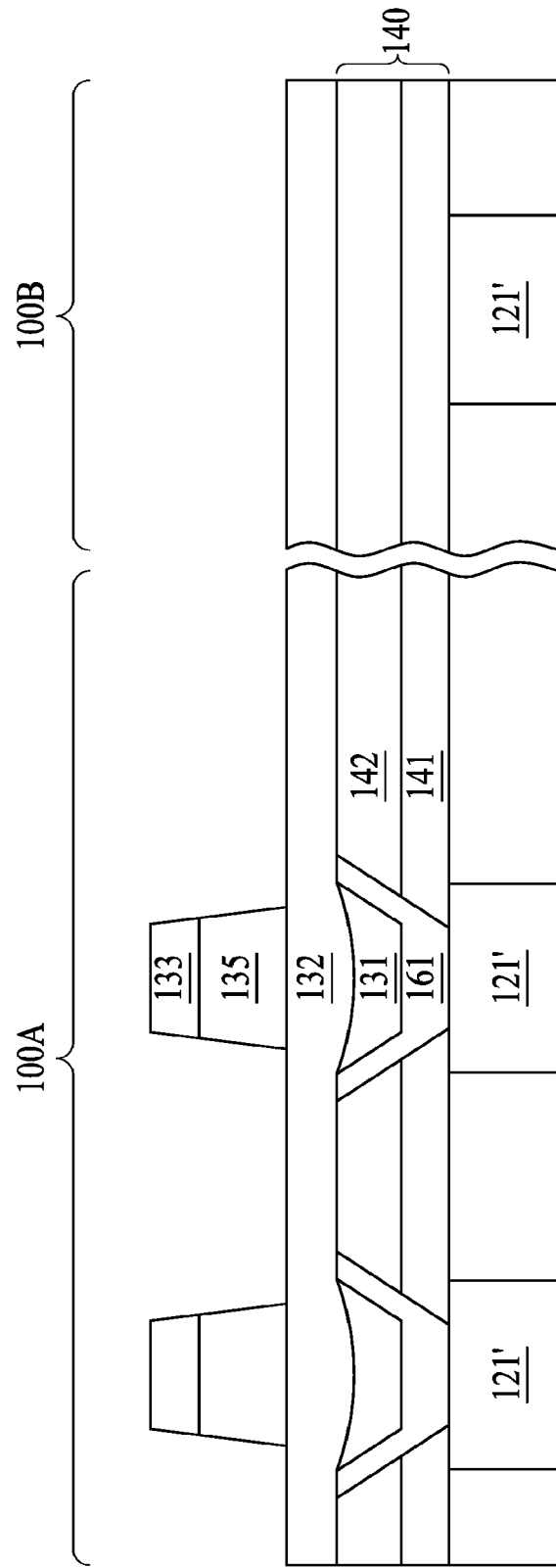

Referring to FIG. 11, a mask layer (not shown) is formed over the top electrode 133 for the ensuing MTJ structure formation. The mask layer may have a multi-layer structure, which may include, for example, an oxide layer, an advanced patterning film (APF) layer and an oxide layer. Each of the oxide layer, the APF layer, and the oxide layer may be formed by a variety of techniques, e.g., high-density ionized metal plasma (IMP) deposition, high-density inductively coupled plasma (ICP) deposition, sputtering, physical vapor deposition (PVD), chemical vapor deposition (CVD), low-pressure chemical vapor deposition (LPCVD), plasma-enhanced chemical vapor deposition (PECVD), and the like. In some embodiments, the mask layer is configured to pattern the MTJ 135 and the top electrode 133. For example, a width of the masking region is determined according to the desired MTJ diameter. In some embodiments, the MTJ 135 and the top electrode 133 are formed by an RIE to have a trapezoidal shape viewing from a cross section. In the present embodiment, the etchants used may be selected from $Cl_2$, $BCl_3$, HBr, $CF_4$, $CHF_3$, $H_2$, $N_2$, CO, $NH_3$, Ar, alcohol and Xe, for example, in order to provide desirable selectivity between the top portion 132 and the MTJ 135. For example, the etchant used in the present etching operation consumes the MTJ 135 substantially faster than the top portion 132 of the bottom electrode 130. In some embodiments, the power used for an RIE operation is from about 50 Watts to about 3000 Watts.

Figure 12:
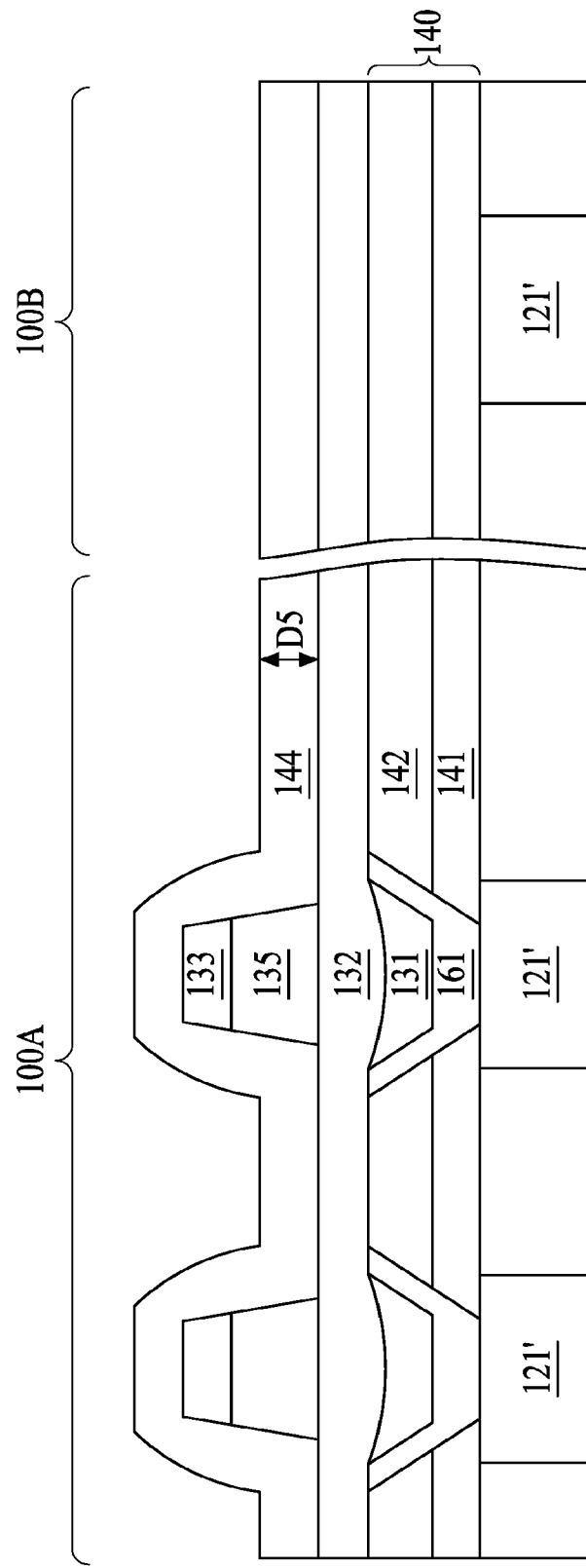
Figure 13:
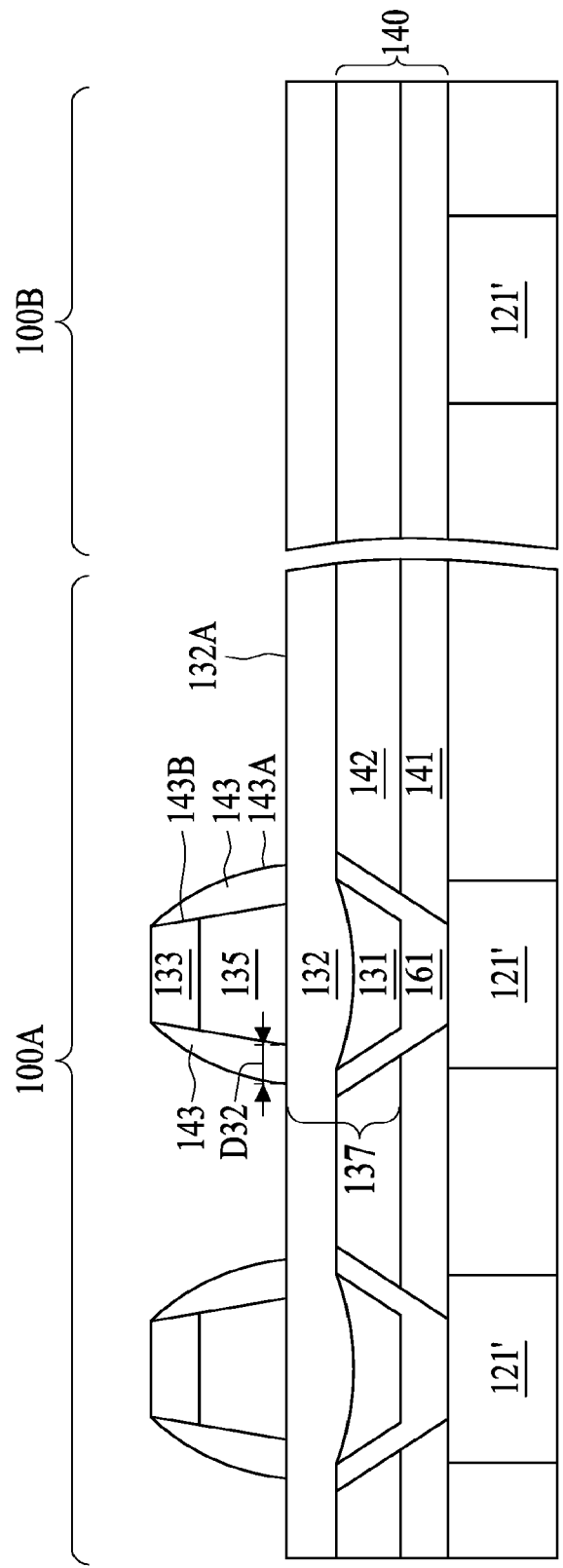

FIGS. 12-13 show formation of the spacer 143 over the MTJ structure 130. Referring to FIG. 12, a dielectric layer 144 is conformally deposited over the top electrode 133, the MTJ 135 and the upper portion 132 of the bottom electrode 137. The dielectric layer 144 may be formed by a variety of techniques, e.g., high-density ionized metal plasma (IMP) deposition, high-density inductively coupled plasma (ICP) deposition, sputtering, physical vapor deposition (PVD), chemical vapor deposition (CVD), low-pressure chemical vapor deposition (LPCVD), plasma-enhanced chemical vapor deposition (PECVD), and the like. The dielectric layer 144 may include materials such as silicon oxide ($SiO_x$), silicon nitride ($SiN_x$), silicon oxynitride ($Si_xO_yN_z$), aluminum oxide ($AlO_x$) and the like. A deposition thickness D5 of the dielectric layer 144 is determined which is closely related to the thickness D32 of the spacer 143 in FIG. 2.

In FIG. 13, a portion of the dielectric layer 144 on the top electrode 133 and on the top portion 132 of the bottom electrode 137 is removed. A top surface of the top electrode 133 and a portion of the top portion 132 of the bottom electrode 137 are exposed such that spacers 143 are formed on the top surface 132A of the upper portion 132A with a remaining thickness D32 measured along the top surface 132A between opposite sidewalls 143A and 143B. Additionally, the spacer 143 laterally surrounds the sidewalls of the MTJ 135 and the top electrode 133. The removing operation may be a suitable dry etch operation. In some embodiments, the dry etch operation in the present embodiment includes reactive ion etch (RIE) adopting fluorine-containing gases. The etch operation is conducted using a suitable etchant, such as $CF_4$, $CHF_3$, $CH_2F_2$, Ar, $N_2$, $O_2$ and He, in order to provide desired etch selectivity between the dielectric layer 144 and the top electrode 133 or top portion 132. In some embodiments, the power used for the etching operation is from about 20 Watts to about 1500 Watts. The etch is stopped at the top surface 132A of the top portion 132 such that the upper portion 132 substantially remains its original thickness after etching.

Figure 14:
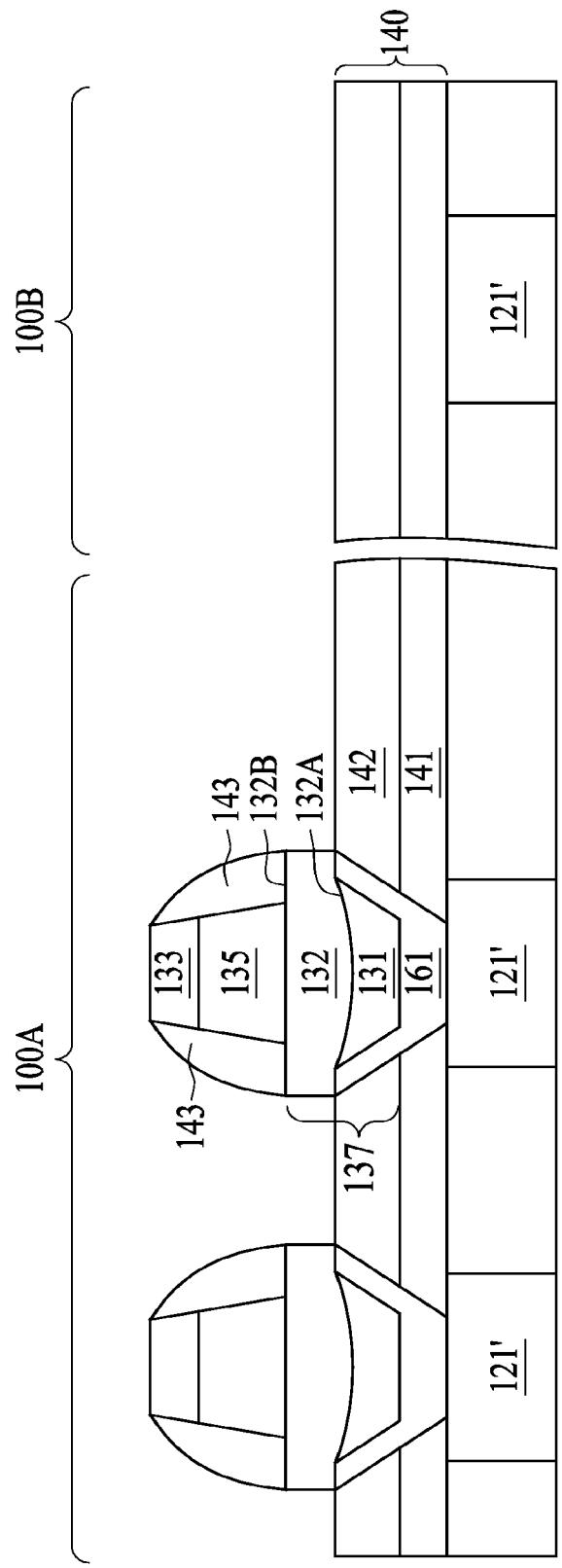

Referring to FIG. 14, a removing operation is performed for patterning the top portion 132 of the bottom electrode 137. The removing operation may be a dry etching operation, such as RIE operation. The etching conditions are determined to supply high selectivity between the top portion material 132 and the material of the composite layer 142 and the spacer 143. For example, the etch gas is selected from $Cl_2$, $BCl_3$, HBr, $CF_4$, $CHF_3$, $N_2$, Ar and He, and the power is controlled at front about 50 Watts to about 2000 Watts. Thus, a portion of the composite layer 142 is exposed after the removing operation. Since the spacer 143 is relatively robust to the etchant, the upper portion 132 positioned under and shielded by the spacer 143 is not consumed by previous etching operation. Consequently, as shown in FIG. 2, the upper portion 132 is formed with a width D3 greater than the width D2 of the bottom surface of the MTJ 135. Furthermore, the width D3 is greater than the width D1 at the bottom surface of the top electrode 133. Also, the width D3 is greater than the width D4 of the top surface 131A of the bottom portion 131 of the bottom electrode 137. In addition, the upper portion 132 is formed with a substantially uniform width D3 from the surface 132A to the surface 132B. In some embodiments, the width D3 may be greater than or less than a width of the BEVA.

In existing approaches for etching 132, a dry etch operation is used which adopts the same etchant for etching MTJ 135. Such dry etch operation possesses little or no selectivity to the dielectric layer 141/142, therefore, the dielectric layer 141/142 can be easily damaged to an extent allowing the underlying Cu atom to out diffuse or directly exposing the underlying Cu conductive lines. In contrast, the multi-step etching operations in the present disclosure prevent the dielectric layer 141/142 surrounding the bottom electrode 137 from being damaged and effectively reduce the chance of migration of underlying Cu atoms, for example.

Additionally, in conventional MRAM devices the bottom portion 131 possesses an uneven surface, for example, a concave surface 131A, due to the dishing effect resulted from a CMP operation. When the overlying top portion 132 of the bottom electrode 137 is thinner than about 80 Å for the sake of better control the etching operation forming the MTJ structure 130, such uneven surface may cause a bottom of the MTJ 135 to be uneven as well. The planarity of the MTJ 135 is crucial to the performance of the MRAM device. Increasing the thickness T3 of the upper portion 132 as shown in FIG. 9 can effective alleviate the uneven bottom surface of the MTJ 135 but at the expense of controlling the etching operation forming the MTJ structure 130. Conventionally, patterning MTJ structure 130 adopts a first etchant formula for the MTJ 135, and a second etchant formula for the upper portion 132 of the bottom electrode 137. The first etchant formula and the second etchant formula are different. Therefore, the thickness T3 of the upper portion 132 is determined to be relatively thin, for example, less than 80 Å, preferably 40 Å, in order to better control the etching operation so as to avoid excessive damage made to the neighboring structures such as the dielectric layer 140. The present disclosure adopts the etchant, such as $CF_4$, $CHF_3$ and $CH_2F_2$, having high selectivity to the upper portion 132 without consuming neighboring layers. Thus, the removal of upper portion 132 can be completed without damaging the neighboring structures such as the dielectric layer 140. The thickness of the upper portion 132 in the present disclosure may be as thick as compensating the uneven surface of the bottom portion 131. In some embodiments, thickness T3 of the upper portion 132 may be in a range of from about 80 Å to about 250 Å.

In some embodiments, the spacer 143 is formed as a protecting mask of the MTJ 135 and the top electrode 133 with respect to the subsequent etching operations. During the dry etching for patterning the upper portion 132 of the bottom electrode 137, metal particles from the upper portion 132 are scattered due to ion bombardment. With the spacer 143 protecting the sidewall of the MTJ 135 and the top electrode 133, and the sputtered metal particles may be deposited to neighboring features, such as the sidewall of the spacer 134, rather than the sidewall of the as-patterned MTJ 135 or the top electrode 133. Therefore, unintentional short circuit or current leakage due to the above redeposition can be effectively prevented.

Figure 15:
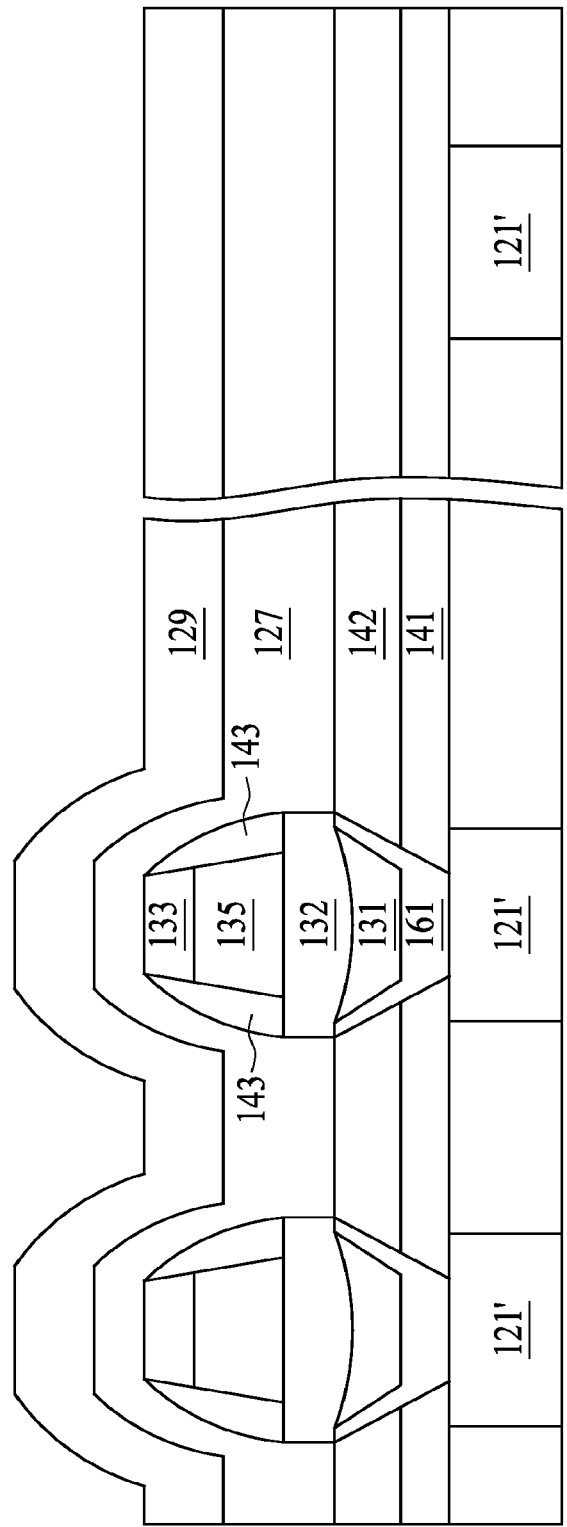
Figure 16:
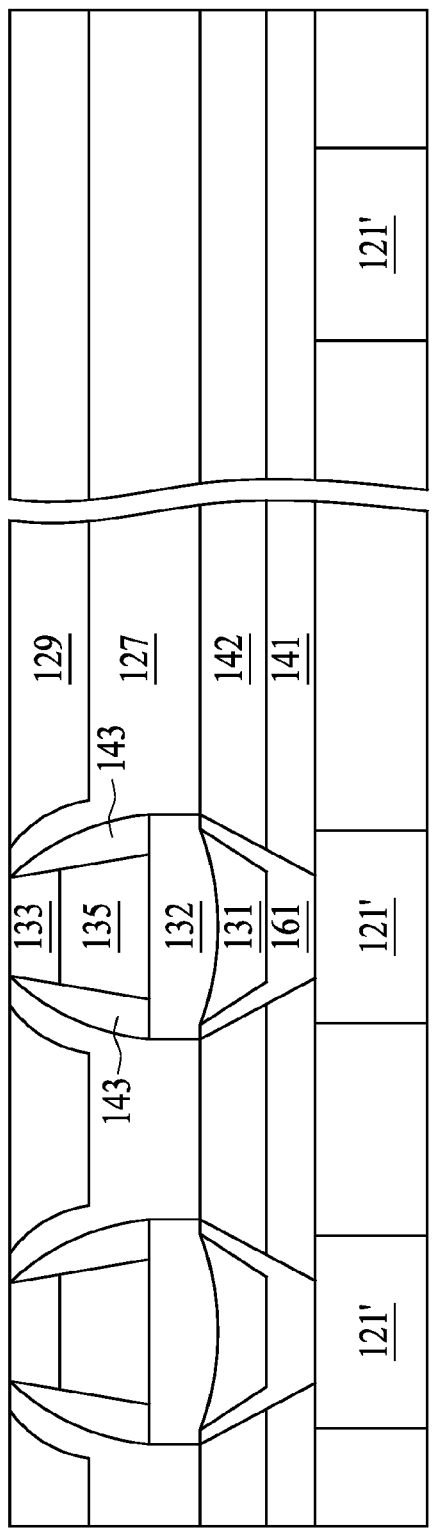

In FIG. 15, a protection layer 127 is conformally formed over the MTJ 135, the top electrode 133, the spacer 143 and the composite layer 141/142. In some embodiments, the protection layer 127 possesses a thickness of from about 50 Å to about 300 Å. Note a sidewall of the MTJ 135 and the sidewalk of the upper portion 132 and spacer 143 are surrounded by the protection layer 127 to prevent oxidation or other contamination. Subsequently, a dielectric layer 129 such as a TEOS layer is conformally deposited over the protection layer 127. In some embodiments, a thickness of the dielectric layer 129 is to be determined according to a level of a top surface thereof relative to the top surface of the top electrode 133 and the top of the spacer 143. For example, a top surface of the dielectric layer 129 at the logic region 100B is to be greater than or about equal to a top surface of the top electrode 133 of an MTJ structure 130. In FIG. 16, a planarization operation is performed on the dielectric layer 129 such that the top surface of the dielectric layer 129 is substantially flat across the MRAM cell region 100A and the logic region 100B. As shown in FIG. 16, the top surface of the top electrode 133 is exposed from the dielectric layer 129 after the planarization operation.

Figure 17:
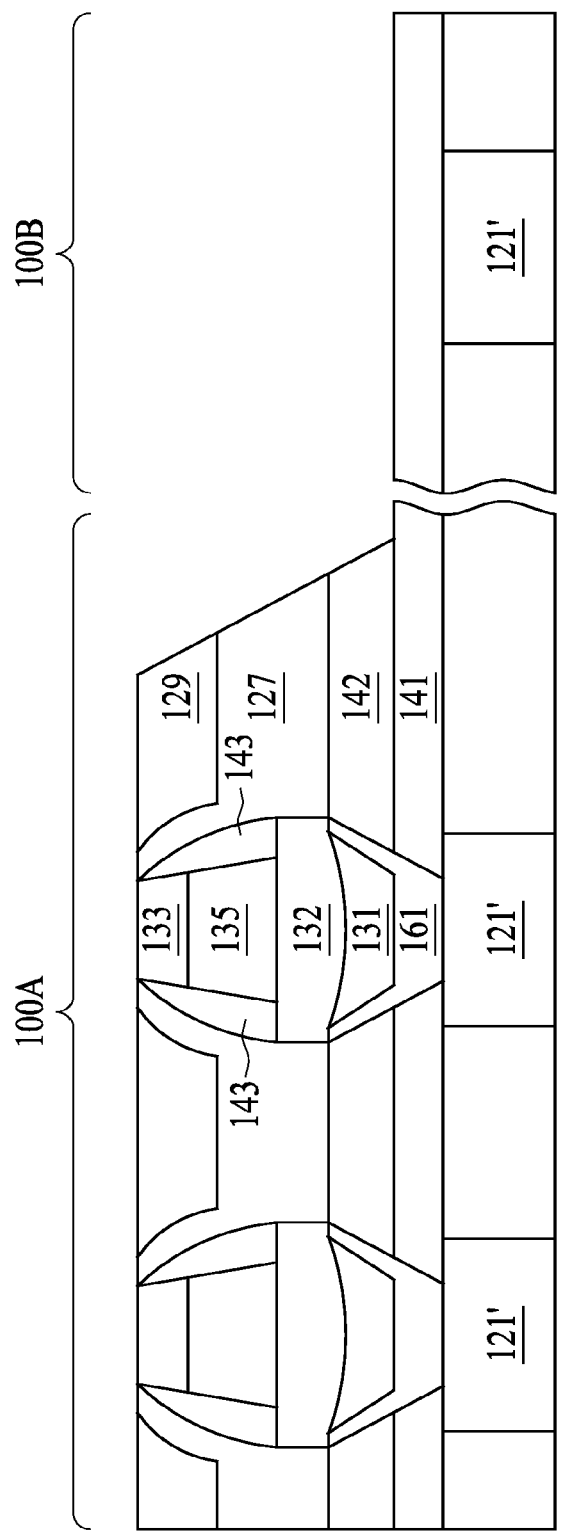
Figure 18:
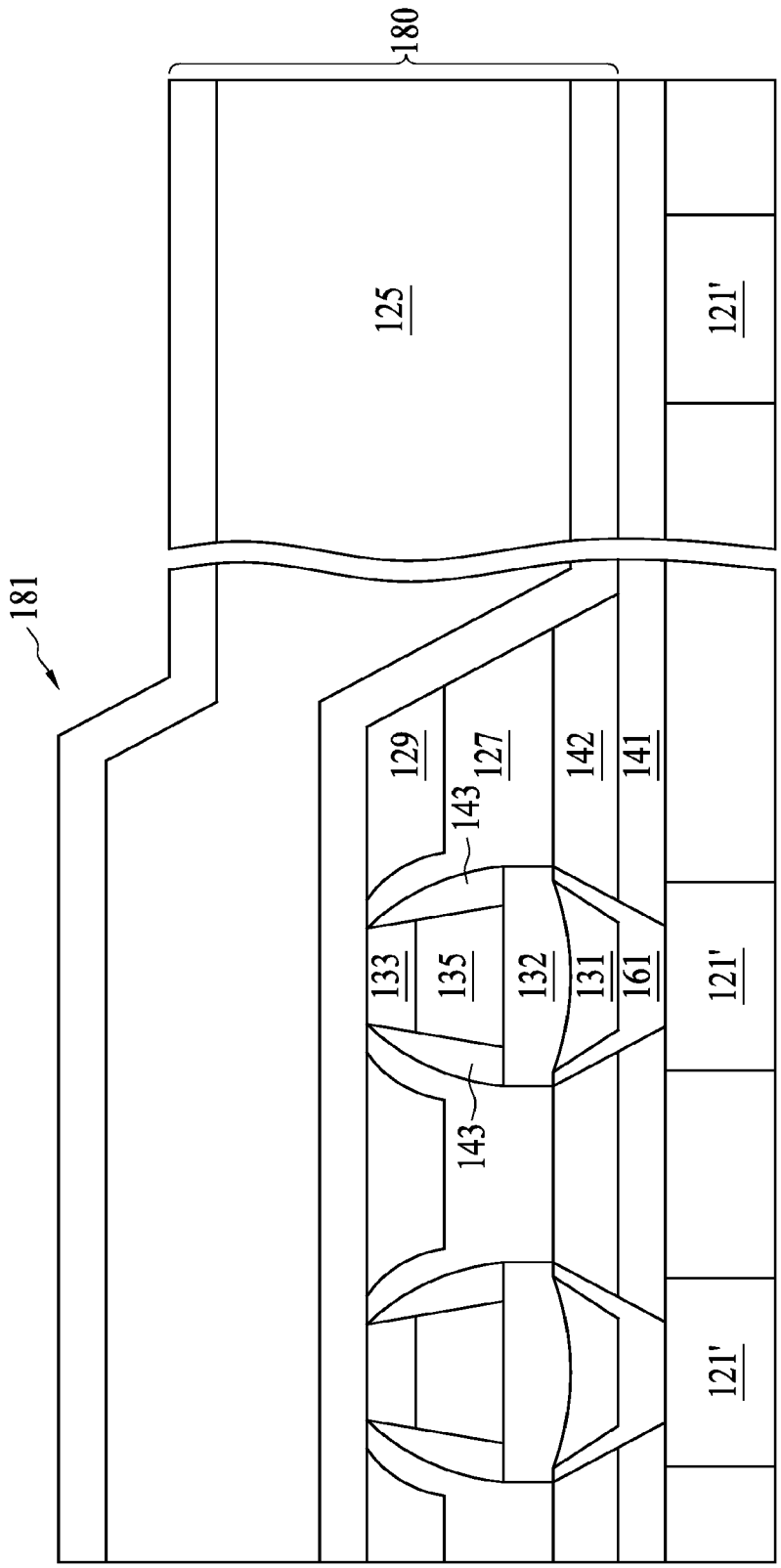
Figure 19:
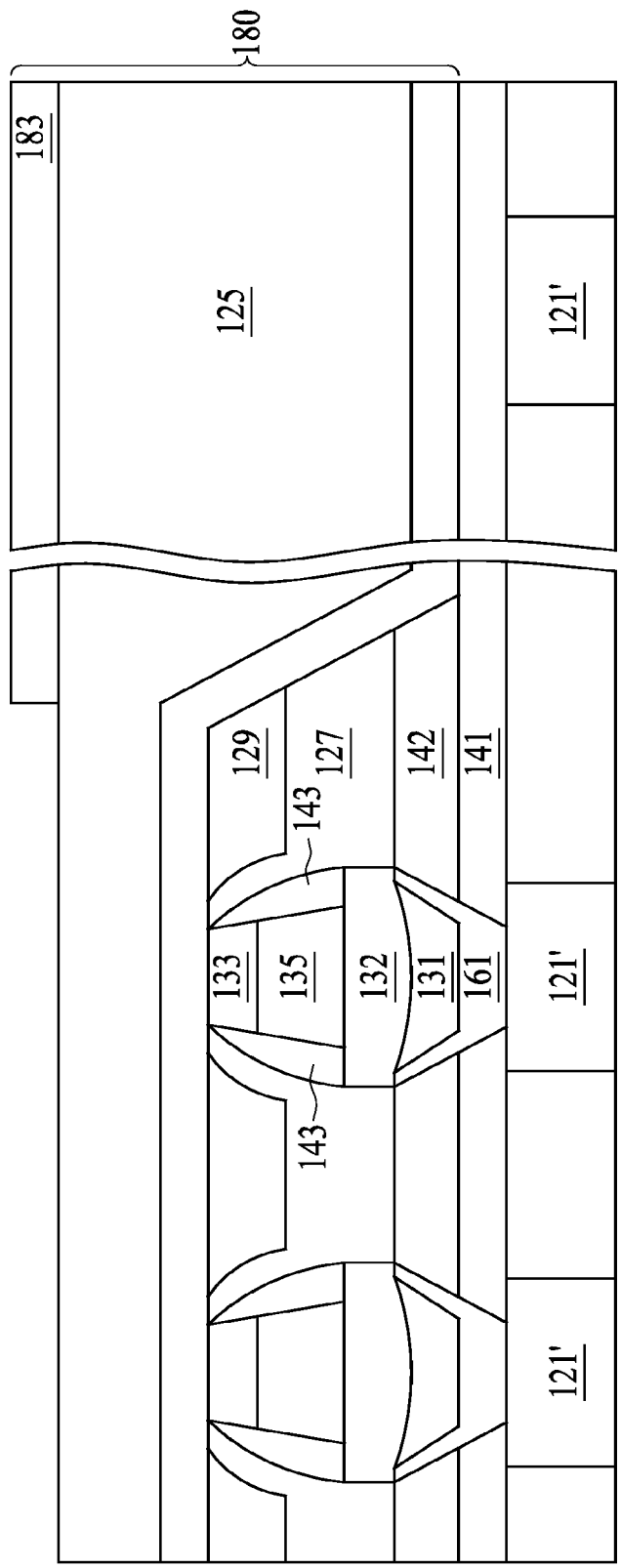

In FIG. 17 to FIG. 19, an upper portion of the barrier layer 140, the protection layer 127, and the dielectric layer 129 are removed from the logic region 100B by an etch back operation, as illustrated in FIG. 17. Hence, the MRAM cell region 100A is in greater height than the logic region 100B. FIG. 18, a dielectric layer-low k-dielectric layer composite 180 is formed to conformally cover the MRAM cell region 100A and the logic region 100B. A step difference 181 can be observed in FIG. 18, therefore, an etch back operation as illustrated in FIG. 19 is performed to obtain a substantially flat top surface for the following trench formation in both the MRAM cell region 100A and the logic region 100B. Note a dielectric layer 183 of the dielectric layer-low k-dielectric layer composite 180 is remained virtually in the logic region 100B after the aforesaid planarization operation. The dielectric layer 183 is deliberately kept to act as a protection layer for the subsequent trench formation. The dielectric layer 183 can prevent the acidic solution from damaging the low k dielectric layer during a photoresist stripping operation.

Figure 20:
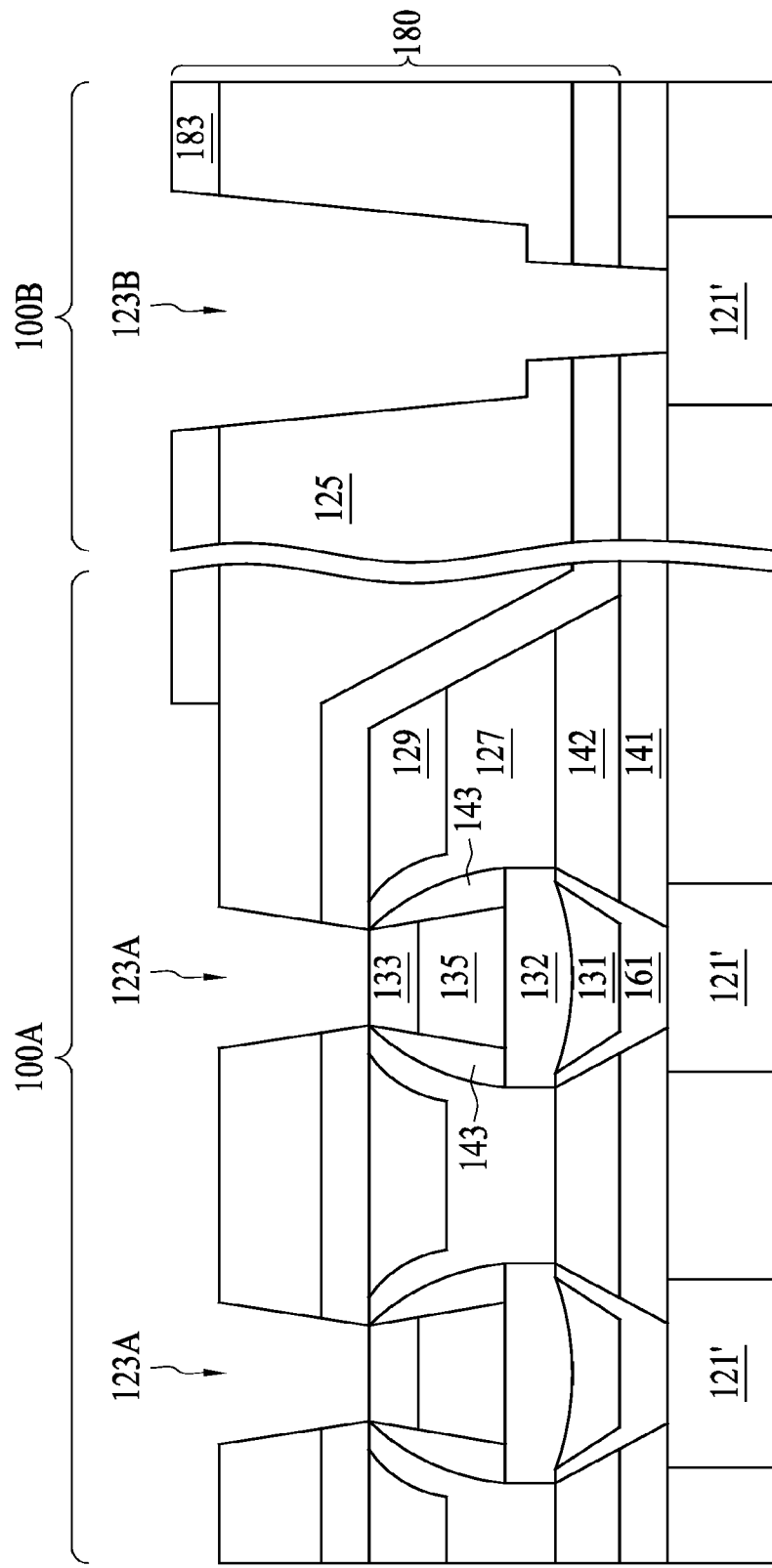

In FIG. 20, photoresist (not shown) is patterned over the planarized dielectric surface to form trenches for metal lines and metal via. For example, in the MRAM cell region 100A, a $(N+1)^{th}$ metal line trench 123A is formed over the MTJ structure 130, exposing a top surface of the top electrode 133 of the MTJ structure 130. In the logic region 100B, an $N^{th}$ metal via trench and an $(N+1)^{th}$ metal line trench (combinatory 123B) is formed over the $N^{th}$ metal line 121', exposing a top surface of the $N^{th}$ metal line 121'.

Figure 21:
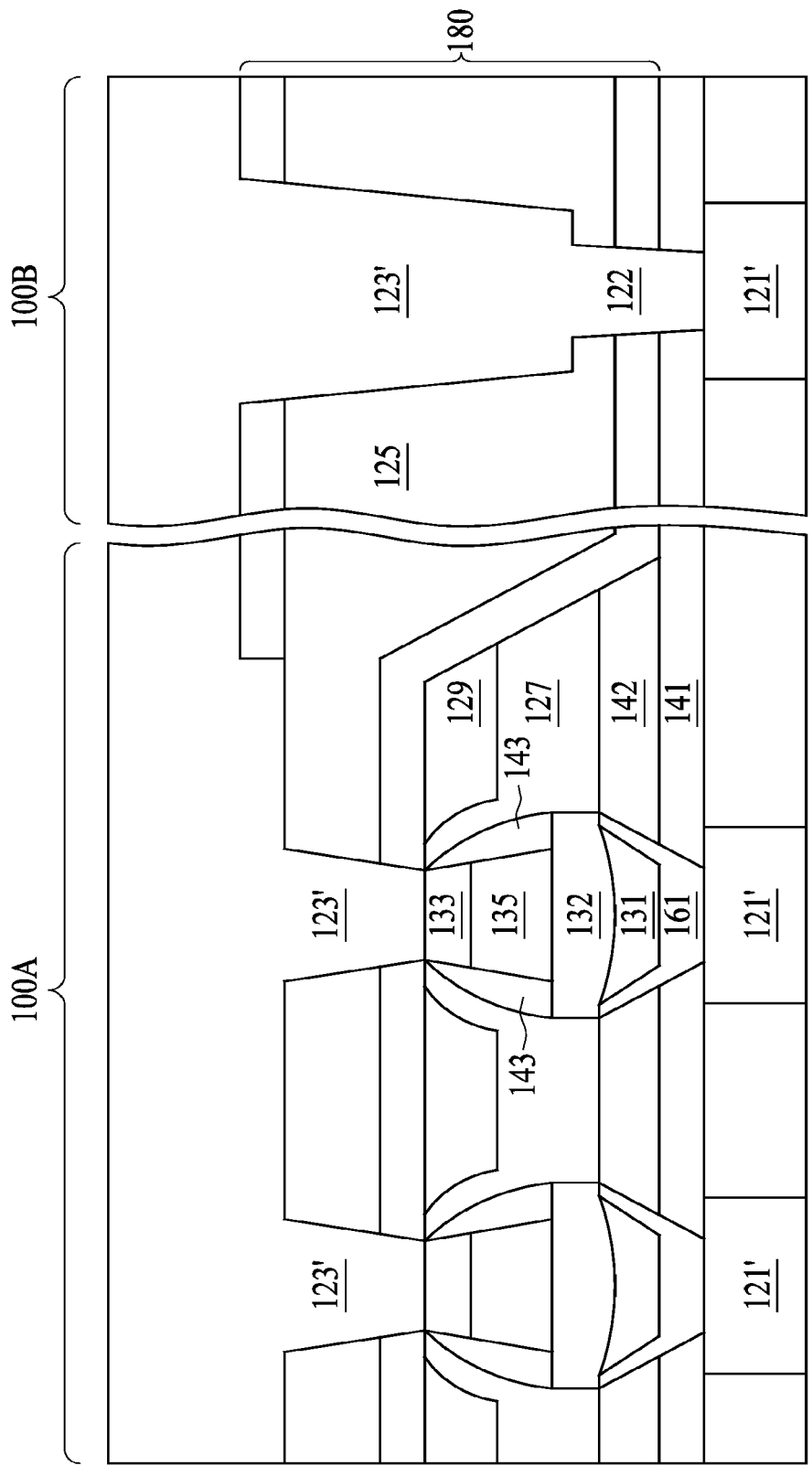
Figure 22:
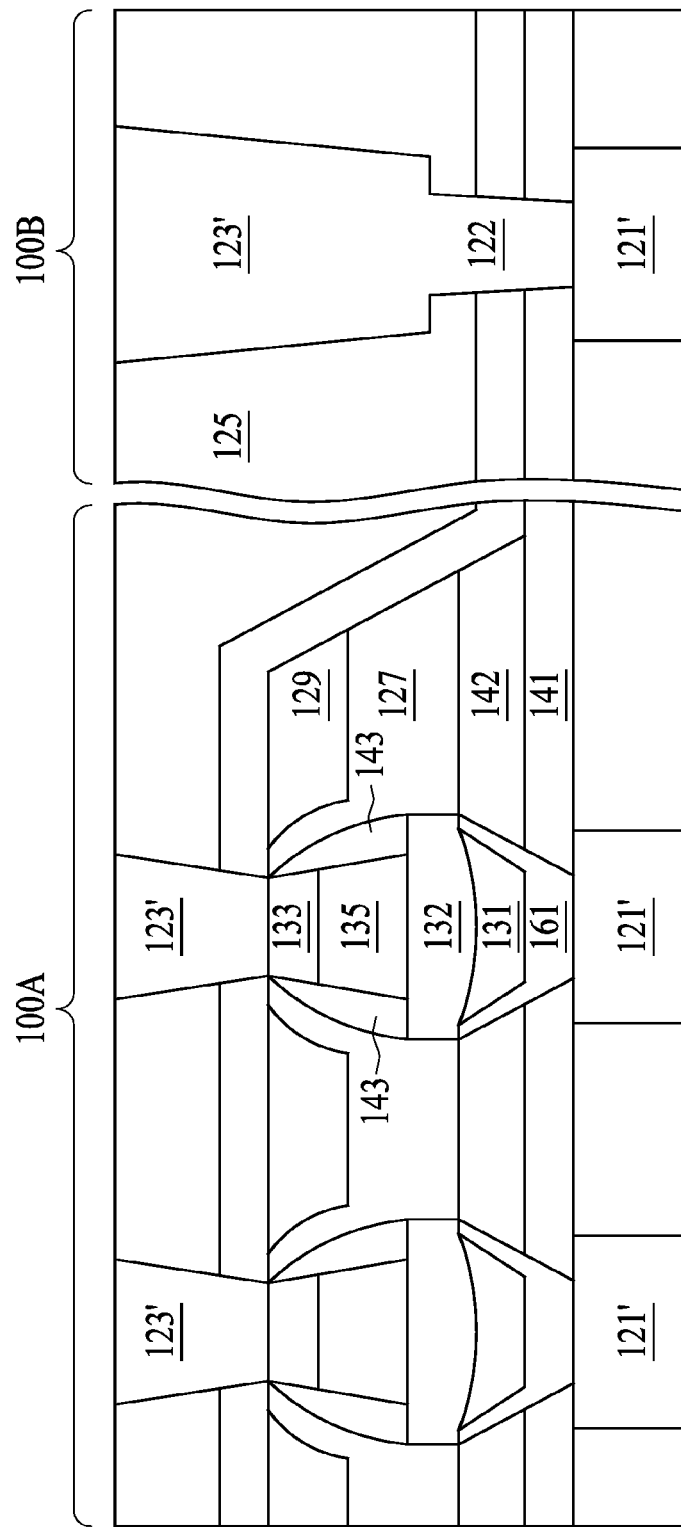

In FIG. 21 and FIG. 22, conductive metal fills the metal line trench/metal via trench (hereinafter "trenches") through, for example, a conventional Dual Damascene operation. The patterned trenches are filled with a conductive material by an electroplating operation, and excess portions of the conductive material are removed from the surface using a chemical mechanical polishing (CMP) operation, an etch operation, or combinations thereof. Details of electroplating the trenches are provided below. $(N+1)^{th}$ metal line 123' may be formed from W, and more preferably from copper (Cu), including AlCu (collectively, Cu). In one embodiment, $(N+1)^{th}$ metal lines 123' are formed using the Damascene operation, which should be familiar to those in the art. First, trenches are etched through the low k dielectric layer. This process can be performed by plasma etch operation, such as an Inductively Coupled Plasma (ICP) etch. A dielectric liner (not shown) then may be deposited on the trenches sidewalls. In embodiments, the liner materials may include silicon oxide ($SiO_x$) or silicon nitride ($SiN_x$), which may be formed by plasma deposition process, such as physical vapor deposition (PVD) or chemical vapor deposition (CVD) including plasma enhanced chemical vapor deposition (PECVD). Next, a seed layer of Cu is plated in the trenches. Note the seed layer of Cu may be plated over a top surface of the top electrode 133. Then a layer of copper is deposited in the trenches, followed by planarization of the copper layer, such as by chemical mechanical polishing (CMP), down to the top surface of a low k dielectric layer. The exposed copper surface and dielectric layer can be coplanar.

Figure 23:
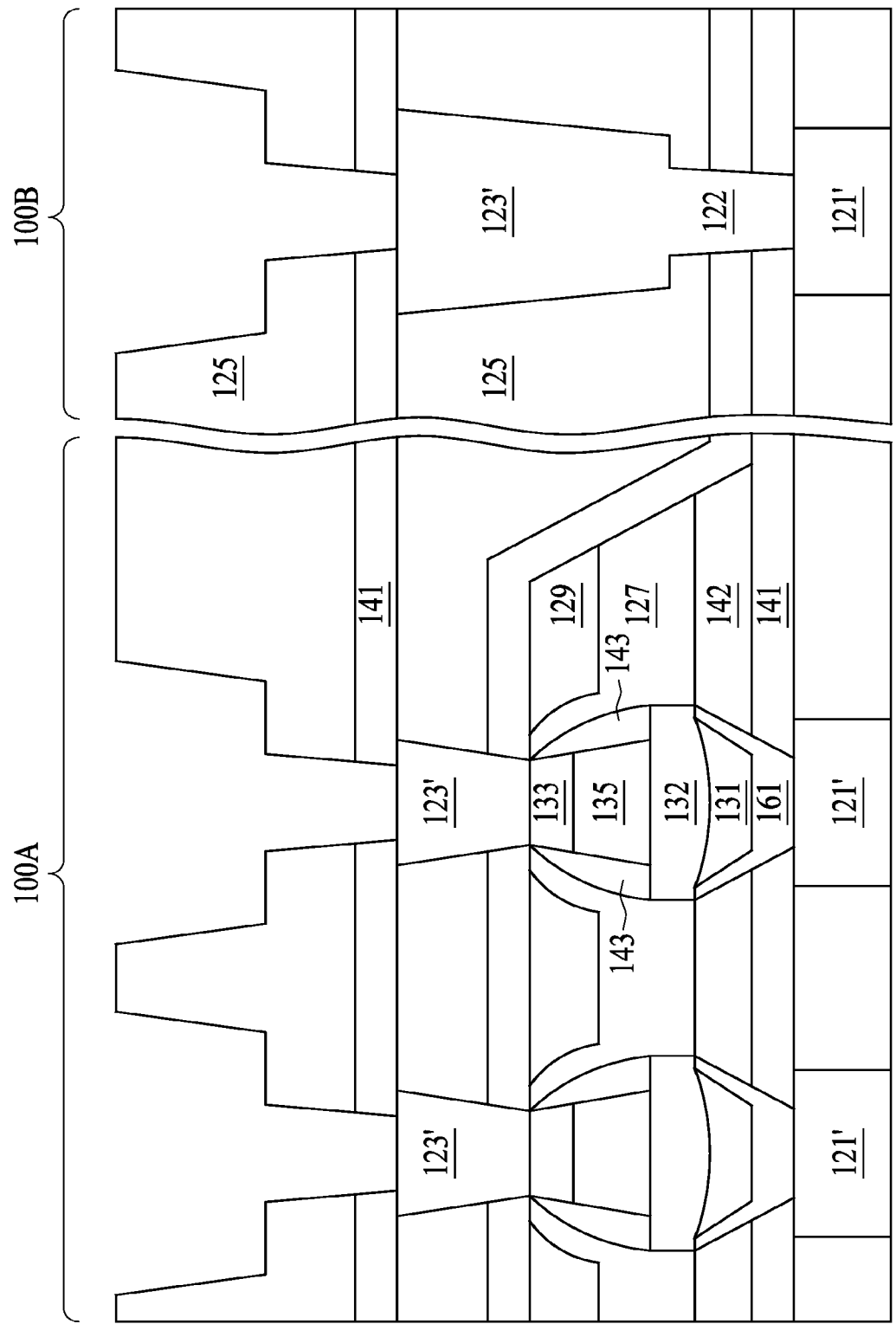

After the planarization operation removing the overburden of the conductive metal as illustrated in FIG. 22, an $(N+1)^{th}$ metal line 123' in both the MRAM cell region 100A and the logic region 100B, as well as an $N^{th}$ metal via 122' in the logic region 100B, are formed. In FIG. 23, a subsequent barrier layer 141 and $(N+1)^{th}$ metal via trench as well as $(N+2)^{th}$ metal line trench are formed in the low k dielectric layer. Subsequent processing may further include forming various contacts/vias/lines and multilayer interconnect features (e.g., metal layers and interlayer dielectrics) over the substrate, configured to connect the various features or structures of the integrated circuit device. The additional features may provide electrical interconnection to the device including the formed metal gate structures. For example, a multilayer interconnection includes vertical interconnects, such as conventional vias or contacts, and horizontal interconnects, such as metal lines. The various interconnection features may implement various conductive materials including copper, tungsten, and/or silicide. In one example a damascene and/or dual damascene process is used to form a copper related multilayer interconnection structure.

Some embodiments of the present disclosure provide a semiconductor structure, including an $N^{th}$ metal layer over a transistor region, where N is a natural number, and a bottom electrode over the $N^{th}$ metal layer. The bottom electrode comprises a bottom portion having a first width, disposed in a bottom electrode via (BEVA), the first width being measured at a top surface of the BEVA, and an upper portion having a second width, disposed over the bottom portion. The semiconductor structure also includes a magnetic tunneling junction (MTJ) layer having a third width, disposed over the upper portion, a top electrode over the MTJ layer and an $(N+1)^{th}$ metal layer over the top electrode. The first width is greater than the third width.

Some embodiments of the present disclosure provide a semiconductor structure including an $N^{th}$ metal layer, a bottom electrode over the Nth metal layer, a magnetic tunneling junction (MTJ) layer over the bottom electrode, and a spacer laterally surrounding the MTJ layer. The bottom electrode comprises a top surface having a first width greater than a second width of a bottom surface of the MTJ layer.

Some embodiments of the present disclosure provide a method for manufacturing a semiconductor structure. The method includes (1) forming an $N^{th}$ metal layer, (2) forming a MTJ structure over the Nth metal layer, (3) forming a spacer over the MTJ structure, surrounding a sidewall of the MTJ structure, and (4) forming an $(N+1)^{th}$ metal above the $N^{th}$ metal.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method of semiconductor device fabrication, comprising:
    providing a substrate having an Nth metal layer with a first portion in a memory region and a second portion in a logic region;
    forming a bottom portion of a bottom electrode interfacing the first portion of the Nth metal layer;
    depositing a conductive material over the bottom portion of the bottom electrode, wherein the conductive material is deposited on the memory region and the logic region;
    forming a magnetic tunneling junction (MTJ) structure over the conductive material in the memory region;
    depositing a dielectric layer over the MTJ structure, wherein the dielectric layer extends over the logic region;
    etching the dielectric layer to form spacers on sidewalls of the MTJ structure, wherein the etching removes the dielectric layer from the logic region; and
    while using the spacers as a masking element, etching the conductive material to form a top portion of the bottom electrode in the memory region and remove the conductive material from the logic region.

2. The method of claim 1, further comprising: forming a barrier layer on the first and second portions of Nth metal layer, the barrier layer extending from the memory region to the logic region, wherein the bottom portion of the bottom electrode extends through the barrier layer.

3. The method of claim 2, wherein the etching the conductive material removes the conductive material from the logic region and exposes the barrier layer.

4. The method of claim 1, wherein the etching the conductive material includes an etchant selected from the group consisting of $CF_4$, $CHF_3$ and $CH_2F_2$.

5. The method of claim 1, further comprising: depositing a protection layer conformally over the MTJ structure and the logic region.

6. The method of claim 5, wherein the protection layer is a nitride layer.

7. The method of claim 5, further comprising: depositing another dielectric layer over the protection layer in the logic region and the memory region.

8. The method of claim 7, further comprising:
etching back the protection layer and the another dielectric layer, wherein the etching back removes the protection layer and the another dielectric layer from the logic region, wherein after the removing the memory region has a height greater than the logic region.

9. A method of semiconductor device fabrication, comprising:
forming a first electrode in a memory region of a substrate;
depositing a conductive material over the first electrode, wherein the conductive material is deposited on the memory region and a logic region spaced a distance from the memory region;
forming a magnetic tunneling junction (MTJ) structure over the conductive material in the memory region;
depositing a dielectric layer over the MTJ structure, wherein the dielectric layer extends over the logic region;
etching the dielectric layer to form spacers on sidewalls of the MTJ structure, wherein the etching removes the dielectric layer from the logic region;
while using the spacers as a masking element, etching the conductive material to form another electrode directly on the first electrode in the memory region and remove the conductive material from the logic region;
depositing a composite layer extending over a top electrode over the MTJ structure, the deposited composite layer extending to the logic region; and
etching back the composite layer in the memory region to form a substantially flat upper surface from the memory region to the logic region.

10. The method of claim 9, wherein the depositing the composite layer includes conformally depositing the composite layer forming a step difference between the memory region and the logic region.

11. The method of claim 9, wherein the composite layer includes a low-k dielectric layer and another dielectric layer over the low-k dielectric layer.

12. The method of claim 11, wherein the etching back the composite layer removes the another dielectric layer from the memory region above the MTJ structure and maintains the another dielectric layer in the logic region.

13. The method of claim 12, further comprising:
forming a first via trench through the low-k dielectric layer to the top electrode; and
forming a second via trench through the another dielectric layer and the low-k dielectric layer in the logic region.

14. A method of semiconductor device fabrication, comprising:
providing a substrate having a metal layer with a first portion in a memory region and a second portion in a device region;
forming a memory component having a first portion of a bottom electrode, a memory structure and a top electrode in the memory region;
depositing a conformal layer of conductive material over the first portion of the bottom electrode and under the memory structure, wherein the conductive material is deposited on the memory region and the device region;
depositing a dielectric layer over the memory component, wherein the dielectric layer extends over the device region;
etching the dielectric layer to form spacers on sidewalls of the top electrode and the memory structure, wherein the etching removes the dielectric layer from the device region and exposes the conductive material; and
etching the conductive material to form a second portion of the bottom electrode in the memory region and remove the conductive material from the device region.

15. The method of claim 14, wherein second portion of the bottom electrode physically interfaces the first portion of the bottom electrode and a bottom surface of a magnetic tunneling junction (MTJ) structure providing the memory structure.

16. The method of claim 14, wherein the etching the dielectric layer to form spacers exposes the conductive material in the device region and the memory region.

17. The method of claim 14, wherein the etching the conductive material to form the second portion of the bottom electrode forms the second portion of the bottom electrode having a width greater than the memory component, the width measured in a cross-section perpendicular a top surface of the substrate.

18. The method of claim 14, wherein the etching the conductive material to form the second portion of the bottom electrode forms the second portion of the bottom electrode having a width greater than a width of the first portion of the bottom electrode, the width measured in a cross-section perpendicular a top surface of the substrate.

19. The method of claim 14, further comprising:
after forming the second portion of the bottom electrode, depositing a composite layer over the memory region and the device region; and
removing a top layer of the composite layer from the memory region to form a thinned layer, while maintaining the top layer of the composite layer in the device region.

20. The method of claim 19, further comprising:
forming a first via hole through the thinned layer in the memory region extending to the top electrode; and
forming a second via hole through the composite layer including the top layer in the device region.

* * * * *